United States Patent [19]
Rhodes

[11] 4,404,674
[45] Sep. 13, 1983

[54] METHOD AND APPARATUS FOR WEIGHTED MAJORITY DECODING OF FEC CODES USING SOFT DETECTION

[75] Inventor: Smith A. Rhodes, Falls Church, Va.

[73] Assignee: Communications Satellite Corporation, Washington, D.C.

[21] Appl. No.: 282,319

[22] Filed: Jul. 10, 1981

[51] Int. Cl.³ .................................................. G06F 11/10
[52] U.S. Cl. .................................................. 371/43
[58] Field of Search .............................. 371/43, 44, 45

[56] References Cited

U.S. PATENT DOCUMENTS

| | | | |
|---|---|---|---|
| 3,662,338 | 5/1972 | Cain | 371/43 |
| 3,665,396 | 5/1972 | Forney, Jr. | 371/43 |
| 3,805,236 | 4/1974 | Battail | 371/43 |
| 4,293,951 | 10/1981 | Rhodes | 371/43 |
| 4,322,848 | 3/1982 | Snyder, Jr. | 371/43 |

*Primary Examiner*—Charles E. Atkinson
*Attorney, Agent, or Firm*—Sughrue, Mion, Zinn, Macpeak, and Seas

[57] ABSTRACT

New techniques are disclosed which utilize soft detection to improve the performance of FEC codes. For an FEC code with minimum Hamming distance, the decoder utilizes hard-detected code symbols to obtain d independent estimates of each information bit, including the detected information symbol itself and d-1 orthogonal parity checks on the information bit. Soft detection is employed for the purpose of computing reliability measures for the d estimates. The reliability numbers serve as weighting coefficients, with the bit decision determined on a weighted majority basis. In one preferred technique, Reliability Majority Decoding (RMD), the reliability of each estimate is determined from some number I of the least reliable of the m hard-detected code symbols contributing to the estimate. For I=1, a simplified logic circuit can be used to determine estimate reliability, while for I=m each symbol is assigned a number of demerits inversely proportional to reliability. The demerits are totalled for each estimate and inverse mapping yields an estimate reliability. In a second preferred technique, all detected symbols are assigned equal weights for purposes of computing parity symbols, but each detected code symbol is then itself assigned a reliability which is used to determine how many parity symbol mismatches are required to overrule the bit estimate. Cascaded feedback decoding techniques can be used to further improve decoding performance. Also disclosed is a technique for providing error protection of parity symbols.

26 Claims, 19 Drawing Figures

METHOD AND APPARATUS FOR WEIGHTED MAJORITY DECODING OF FEC CODES USING SOFT DETECTION

BACKGROUND OF THE INVENTION

In modern communications, a great deal of data is transmitted in digital form but, due to signal degradation over the transmission path, there are occasional errors in the signal regenerated at the receiver. A number of techniques have been devised for detecting and correcting these errors, the most obvious being the detection of errors at the receiver and the request of a retransmission. In many applications, however, retransmission is impractical and, therefore, error correcting codes have been devised in which the errors can be detected and corrected by decoding techniques at the receiver without the benefit of retransmission.

Maximum-likelihood decoding is typically used for error correction, i.e., the information sequence is selected that corresponds to the sequence with the best agreement to the detected sequence of received code symbols.

Above one such maximum-likelihood decoding technique is known as majority logic decoding in which modulo-2 sums of hard-detected code symbols are used for parity checks on each decoded information bit. An encoder at the transmitter generates a plurality of parity symbols and transmits these together with the information symbols. At the receiver, a decoder receives the transmitted information symbols as well as the transmitted parity symbols and regenerates a set of parity symbols from the received information bits. The received and regenerated parity symbols are then compared and, if enough of the received and regenerated parity symbols match, the information bit is considered correct. If too many of the received and regenerated parity symbols disagree, the bit will be considered an error and will be "corrected". In the case of a binary digital system in which each bit is either a "1" or a "0", the correction will be accomplished by merely adding a "1" to the detected information bit in a modulo-2 adder. Such a technique is well known and is described in *Threshold Decoding*, by James L. Massey, M.I.T. Press, Cambridge, Massachusetts, 1963.

FIG. 1 depicts a Tapped Delay Line (TDL) encoder of constraint length $K=7$ that produces a self-orthogonal systematic convolutional code of rate 0.5 with $J=4$ parity checks on each information symbol. The encoder includes a seven-stage shift register 10 having tap connections 12 to four of the stages. The tap connections are combined in an adder 14, the output of which is a parity symbol $U_n$. For each new symbol $X_n$ received in the first stage of shift register 10, the information symbol $X_n$ and parity symbol $U_n$ are transmitted, thus yielding a code rate of $\frac{1}{2}$. The tap connections are defined by $\alpha_0=1$, $\alpha_1=1$, $\alpha_2=0$, $\alpha_3=0$, $\alpha_4=1$, $\alpha_5=0$, $\alpha_6=1$. Note that any information bit will remain in the TDL for only K bit periods. Therefore, J parity equations on each information bit will be produced within K successive parity symbols. For the nth information bit, the appropriate parity equations are:

$$U_n = X_n + X_{n-1} + X_{n-4} + X_{n-6}$$

$$U_{n+1} = X_{n+1} + X_n + X_{n-3} + X_{n-5}$$

$$U_{n+2} = X_{n+2} + X_{n+1} + X_{n-2} + X_{n-4}$$

$$U_{n+3} = X_{n+3} + X_{n+2} + X_{n-1} + X_{n-3}$$

$$U_{n+4} = X_{n+4} + X_{n+3} + X_n + X_{n-2}$$

$$U_{n+5} = X_{n+5} + X_{n+4} + X_{n+1} + X_{n-1}$$

$$U_{n+6} = X_{n+6} + X_{n+5} + X_{n+2} + X_n$$

It is seen that $X_n$ is contained in $J=4$ parity equations; $U_n$, $U_{n+1}$, $U_{n+4}$, and $U_{n+6}$. No other term is included in more than one of these four equations. Thus, the $J=4$ equations are orthogonal on $X_n$. Because of the generality of the equations ($X_n$ is the nth term), there are $J=4$ orthogonal parity equations on each information bit. These are the equations generated when the information bit passes the tap connections in the encoder. Note that all $K-1=6$ terms that immediately precede and follow $X_n$ are contained in the $J=4$ parity equations on $X_n$. Thus, the code is "perfect" in the sense that all possible combinations of information symbols are utilized in the parity checks. Consequently, no other self-orthogonal code with $J=4$ parity checks can be constructed more efficiently such as to require less encoder stages. Note that 4 equations with 4 terms each necessitate 16 total terms, $X_n$ four times and 12 other terms once each. If these 12 terms are not the six adjacent to $X_n$ on each side, a longer constraint length than $K=7$ will be required. It may be possible to obtain $J=4$ orthogonal equations from a shorter constraint length if the code is not self-orthogonal. In such a case, orthogonal equations may be obtained from linear combinations of the parity symbols, whereas self-orthogonality requires that the orthogonal equations are obtained directly without any manipulation or combining of parity symbols.

An additive white Gaussian channel is assumed in which the received signal is the code symbol corrupted by noise. Let $\delta_n$ and $\epsilon_n$ denote independent Gaussian samples with zero means and equal variances. Then, the received code symbols plus noise are given by:

$$x_n = X_n + \delta_n$$

$$u_n = U_n + \epsilon_n$$

At the detector, $x_n$ and $u_n$ are quantized into digital estimates $X'_n$ and $U'_n$ of the code symbols $X_n$ and $U_n$, respectively. Then, the detected information symbols $X'_n$ are used as inputs to a replica of the encoder. The output of this device is a regenerated estimate $U''_n$ of the parity symbol $U_n$. Also, the detected parity symbol $U'_n$ is an estimate of $U_n$. Thus, the modulo-2 sum of $U''_n$ and $U'_n$ is taken to determine if these two estimates agree. The output of this mod-2 addition is the parity check symbol $A_n$. The sequence of parity checks is termed the syndrome. The syndrome is used in algebraic decoding techniques to estimate the error sequence $\{e_n\}$. If the error sequence is within the error-correcting capability of the code, the error estimates will be correct. Each error estimate $e_n$ is added modulo-2 to the detection estimate $X'_n$ to obtain the decoded value of $X_n$. The decoder estimate of $X_n$ is termed $\hat{X}_n$. Thus, with modulo-2 addition, $$X'_n = X_n + e_n$$

$$\hat{X}_n = X'_n + e_n$$

Note that there are J=4 parity checks on $X_n$. These are given by:

$$C_{n1} = A_n = U'_n + U''_n = U'_n + X'_n + X'_{n-1} + X'_{n-4} + X'_{n-6} \quad (1)$$

$$C_{n2} = A_{n+1} = U'_{n+1} + U''_{n+1} =$$

$$U'_{n+1} + X'_{n+1} + X'_n + X'_{n-3} + X'_{n-5}$$

$$C_{n3} = A_{n+4} = U'_{n+4} + U''_{n+4} =$$

$$U'_{n+4} + X'_{n+4} + X'_{n+3} + X'_n + X'_{n-2}$$

$$C_{n4} = A_{n+6} = U'_{n+6} + U''_{n+6} =$$

$$U'_{n+6} + X'_{n+6} + X'_{n+5} + X'_{n+2} + X'_n$$

Note that $X_n$ cannot be decoded until $U'_{n+6}$ and $X'_{n+6}$ are obtained. Thus, there is a decoding delay of $K-1=6$ information bit intervals.

Threshold decoding is a generic term for a method of performing weighted majority decisions, in which the $J+1$ estimates on $X_n$ are assigned weighting coefficients $w_j$, $j=0$ to $J-1$. Thus, $w_o$ is the weight given to the detection estimate $E_{no}$. Define by $\lambda_1$ the sum of the weights for the other estimates $E_{nj}$ that disagree with the detection estimate. Also define as $\lambda_o$ the sum of the weighting factors for the other $E_{nj}$ estimates that are in agreement with $E_{no}$. Thus, $$\lambda_1 = \sum_{j=1}^{J} w_j C_{nj}$$

$$\lambda_o = \sum_{j=1}^{J} w_j (1 - C_{nj})$$

Weighted majority decoding is accomplished by selecting the value of "1" or "0" for $X_n$ in accordance with the estimate that has the greatest total weight. The total weighting in favor of the detection estimate $E_{no}$ is $w_o + \lambda_o$. Also, the total weighting for disagreements with the detection estimate is $\lambda_1$. Then, the decoding estimate is given by:

$$X_n = \begin{cases} \hat{X}_n & \text{if } \lambda_1 < w_o + \lambda_o \\ X'_n + 1 & \text{if } \lambda_1 > w_o + \lambda_o \end{cases}$$

An agreement of $E_{nj}$ with $E_{no}$ means that the jth parity check is good, or $C_{nj}=0$. Similarly, disagreement of $E_{nj}$ with the detection estimate implies that the parity check fails, or $C_{nj}=1$. Thus, threshold decoding is usually based on the parity checks, which are defined by:

$$C_{nj} = E_{no} + E_{nj}, j=1 \text{ to } J$$

The value of the detection estimate is changed only when the sum $\lambda_1$ of the weights $w_j$ for which $C_{nj}=1$ exceeds the weight $w_o$ of the detection estimate plus the sum $\lambda_o$ of the other $w_j$ weights for which $C_{nj}=0$. Note that:

$$\lambda_1 > w_o + \lambda_o \longrightarrow 2\lambda_1 > w_o + \lambda_o + \lambda_1 \text{ But}$$

$$w_o + \lambda_o + \lambda_1 = \sum_{j=0}^{J} w_j$$

Now define the decoding threshold by:

$$\Gamma = \frac{1}{2}(w_o + \lambda_o + \lambda_1) = \frac{1}{2} \sum_{j=0}^{J} w_j$$

Then, for threshold decoding, the detection estimate of $E_{no} = X'_n$ is corrected only if $\lambda_1 > \Gamma$, that is, only when $$\sum_{j=1}^{J} C_{nj} w_j > \frac{1}{2} \sum_{j=0}^{J} w_j$$

Majority-logic decoding usually refers to the special case described in which the weighting coefficients $w_j$ are all assigned unity values. Such a decoding technique is disclosed in U.S. Pat. No. 3,622,338 to Cain. Note that in such a special case the threshold for equal weighting is one-half of the total number of independent estimates on each information symbol.

$$\Gamma = \frac{1}{2} \sum_{j=0}^{J} w_j = (J+1)/2$$

Also, the total weight $\lambda_1$ for the disagreeing estimates is equal to the number $N_D$ of disagreements for the $C_{nj}$ estimates relative to the detection estimate $X'_n$.

$$\lambda_1 = N_D = \sum_{j=1}^{J} C_{nj}$$

Also, let $N_A$ represent the number of $E_{nj}$ estimates on $X_n$ that agree with the detection estimates. Then the total of all the weights is $J+1$.

$$\sum_{j=0}^{J} w_j = w_o + \lambda_o + \lambda_1 = 1 + N_A + N_D = J + 1$$

Thus, in majority logic decoding, the detection estimate is changed or corrected only if the number $N_D$ of disagreements exceeds one-half of the total number of estimates. Equivalently, over one-half of the parity checks on $X_n$ must fail ($C_{nj}=1$) if the detection estimate is to be changed. Hence, threshold decoding can be used as the generic term for majority decoding that may or may not include unequal weighting of the $J+1$ estimates of each received information bit.

FIG. 2 illustrates a typical majority-logic decoder for detected code symbols. The information symbols $X_n$ and parity symbols $U_n$ having been transmitted over an additive white gaussian channel, are corrupted by noise and are received at a detector 20 as received code symbols $x_n$ and $u_n$, respectively. The detected information symbols $X'_n$ are provided to an encoder replica consisting of a shift register 22, tap connections 24 and adder 26 similar in design and operation to their counterparts in the encoder. At each stage of a given information symbol $X'_n$ in the encoder replica, a recreated parity symbol $U''$ is generated at the output of the adder 26. These recreated parity symbols are combined with the detected parity symbols $U'$ in a modulo-2 adder 28, the output of which is provided to a syndrome register 30. If all of the recreated parity symbols agree with the detected parity symbols, their modulo-2 sums will be 0, and the contents of the syndrome register 30 will be all zeros. The majority decision circuitry 32 will examine the four orthogonal parity checks on $X_n$, determine that all parity symbols are in agreement, and provide a "0" output signal $\hat{e}_n$ to the correction modulo-2 adder 34. Under this condition, the detection estimate $X'_n$ will be considered correct and will not be changed by the adder 34.

On the other hand, if an excessive number of the recreated and detected parity symbols are in disagreement, the majority decision circuitry 32 will provide a "one" output signal to the adder 34, thus resulting in a change in the detection estimate $X'_n$.

Because of the orthogonality condition, any symbol other than $X'_n$ can affect only one of the parity checks on $X_n$. If $X_n$ is correct, up to $J/2$ errors in these symbols will cause no more than $J/2$ parity checks to fail (have logical "1" value). If $X'_n$ is in error and at most $(J/2)-1$ other symbols are in error in the J parity checks on $X_n$, then at least $(J/2)+1$ of these parity checks will fail. Therefore, up to $J/2$ errors can be corrected on a majority basis. If $J/2$ or less parity checks fail ($C-1$ for $J/2$ or less checks), the error estimate is $e=0$. Thus, the detection estimate is not altered by decoding. If $c=1$ for more than $J/2$ parity checks, then $\hat{e}_n=1$, and the decoder changes the detection estimate to its complement.

Of the J parity checks that are used to decode a given information symbol, $J-1$ of these checks will be used later for decoding other information symbols. When the information bit is determined to be in error it is, of course, corrected. However, this assumed symbol error would make the J parity checks to be questionable. Thus, the $J-1$ parity checks that are to be used later would be unreliable. Therefore, the decoding performance can be improved if these $J-1$ parities are complemented to improve their reliability for future use. Feedback of the error estimate $\hat{e}_n$ can thus be used to correct the parity checks on $X_n$ that are to be utilized for majority decisions on other information symbols.

Such a feedback scheme is depicted in FIG. 3 for "syndrome resetting". The error correction signal is fed back to modulo-2 adders 36, 38 and 40 to complement the contents of those stages of the syndrome register which were used in the majority decision, thus rendering these parity checks somewhat more reliable.

Note that each of the $J=4$ parity equations on $X_n$ may be written as the modulo-2 sum of $X_n$ plus other terms. With $E_{nj}$ used to denote the terms other than $X'_n$ in the jth parity check on $X_n$, the $J=4$ parity checks on $X_n$ may be written as:

$$C_{n1} = A_n = U'_n + U''_n = X'_n + E_{n1}$$

$$C_{n2} = A_{n+1} = U'_{n+1} + U''_{n+1} = X'_n + E_{n2}$$

$$C_{n3} = A_{n+4} = U'_{n+4} + U''_{n+4} = X'_n + E_{n3}$$

$$C_{n4} = A_{n+6} = U'_{n+6} + U''_{n+6} = X'_n + E_{n4}$$

Thus, in terms of mod-2 addition, $$E_{n1} = C_{n1} + X'_n = U'_n + X'_{n-1} + X'_{n-4} + X'_{n-6}$$

$$E_{n2} = C_{n2} + X'_n = U'_{n+1} + X'_{n+1} + X'_{n-3} + X'_{n-5}$$

$$E_{n3} = C_{n3} + X'_n = U'_{n+4} + X'_{n+4} + X'_{n+3} + X'_{n-2}$$

$$E_{n4} = C_{n4} + X'_n = U'_{n+6} + X'_{n+6} + X'_{n+5} + X'_{n+2}$$

Such a technique of using decoder decisions for syndrome resetting is known as Decision FeedBack (DFB). An alternative implementation is Partial FeedBack (PFB), in which a parity term is updated by feedback only if it originally had a "1" value.

In the absence of errors in detection, the syndrome sequence of parity checks $\{A_n\}$ will contain all zeros. Therefore, any $E_{nj}$ term, which includes all terms of the corresponding parity check $C_{nj}$ except $X'_n$, will be equal to $X_n$ in the absence of detection errors. Because of the orthogonality of the parity equations, each $E_{nj}$ can be considered as an independent estimate of $X_n$. Also, the detected value of $X_n$ can be used as another independent estimate, termed $E_{no}$. Hence, there will be $J+1=5$ independent estimates of each information symbol, as given by:

$$E_{no} = X'_n$$

$$E_{n1} = U'_n + X'_{n-1} + X'_{n-4} + X'_{n-6}$$

$$E_{n2} = U'_{n+1} + X'_{n+1} + X'_{n-3} + X'_{n-5}$$

$$E_{n3} = U'_{n+4} + X'_{n+4} + X'_{n+3} + X'_{n-2}$$

$$E_{n4} = U'_{n+6} + X'_{n+6} + X'_{n+5} + X'_{n+2}$$

In general, the decoded or corrected value $\hat{X}_n$ of $X_n$ will be some function of the $J+1=5$ independent estimates of its value.

$$\hat{X}_n = G[E_{n0}, E_{n1}, E_{n2}, E_{n3}, E_{n4}]$$

In the usual implementation of the majority decoding, the decoder accepts only hard-detected code symbols and the d estimates are given equal weighting. Although this may be the simplest method of majority decoding, it is also the least accurate. Decoding performance can be substantially improved if each estimate is weighted in accordance with its reliability, as determined from the soft-detection levels of the code symbols involved in the estimate. In "hard" detection, only the presence or absence of a "1" is determined, but in "soft" detection, the level of the received voltage is monitored, with the reliability of that signal being determined by how close the detected voltage level is to a "1" or a "0".

"A posteriori probabilistic" (APP) decoding is threshold decoding with the weighting coefficients chosen to optimize the decoding performance on a probabilistic basis. Let $P_j$ denote the probability that the jth estimate of $X_n$ is in error. Also, define $Q_j = 1 - P_j$ as the probability of correct estimation. As shown by Massey, the weighting coefficients for APP decoding are given by:

$$w_j = H \log (Q_j/P_j)$$

where H is an arbitrary constant. Unless $P_j$ and $Q_j$ are time variant there appears to be no significant gain to be achieved by weighting in accordance with APP decoding. For a time-invariant case, for $j \neq 0$, all $P_j$ values are equal for self-orthogonal codes, that have an equal number of terms in each parity check. Because $P_o \cong P_j/J$, $w_0$ will be slightly higher than the other $w_j$ in APP decoding. When the received voltage levels are observed prior to detection, $P_j$ and $Q_j$ will be conditional probabilities that are time variant in accordance with the received levels of signal plus noise for the code symbols used to obtain the jth estimate of $X_n$.

A rigorous determination of the optimum weighting coefficients for APP would necessitate processing of considerable complexity, and this optimum technique is difficult to implement for other than low-speed applications. It would be desirable to find a suboptimum weighting method yielding decoding results almost as good as APP weighting while reducing the complexity of the weighting algorithm.

A further technique is disclosed in U.S. Pat. No. 3,609,682, to Mitchell. The Mitchell patent describes a simple case of 3-level soft-detection for improving performance of majority decoding. The weighting of each estimate is either unity or zero, i.e., the estimate is considered completely reliable or completely unreliable. An estimate is not used when considered unreliable, and this zero reliability weighting is given when the received voltage level of any code symbol used to form the estimate falls within the "null" zone of the soft-detector. Thus, the Mitchell technique loses some coding gain in discarding estimates altogether.

A still further soft detection technique is disclosed in U.S. Pat. No. 3,805,236 to Battail, in which soft-detection is used for variable reliability weighting of all estimates of an information bit, which is decoded on a weighted majority basis. Two weightings are disclosed in Battail, (1) assigning a likelihood weighting of the least reliable term to each estimate, and (2) the addition of the logarithms of individual likelihood numbers for each term to obtain the weighting coefficient for each estimate. It would be desirable even with the Battail techniques to utilize less complex weighting hardware.

SUMMARY OF THE INVENTION

It is an object of this invention to provide a technique for weighted majority decoding which is capable of realizing significant coding gains without the necessity of highly complex and costly circuitry.

Briefly, this is achieved by a decoding technique in which each estimate is based upon hard-detected decoding decisions but soft-detection is employed for the purpose of assigning reliability values to the estimates. The estimates are then weighted in accordance with the reliability measures before a majority decision is made. In one disclosed technique, reliability majority decoding (RMD), the weighting function is the product of individual weighting factors of some number I of the least-reliable of the m terms in each estimate. The individual reliability factors are linear functions of the soft-detected voltage levels. For I=1, a simplified logic circuit can be used to determine estimate reliability, while for I=m each symbol is assigned a number of demerits inversely proportional to reliability. The demerits are totalled for each estimate and inverse mapping yields an estimate reliability.

In a second technique known as weighted information reliability (WIR) decoding, all detected symbols are assigned equal weights for purposes of computing parity symbols, but each hard-detected code symbol is itself assigned a reliability which is used to determine how many parities are required to overrule the bit estimate.

A further improvement is the use of tandem decoders, the first being used to improve the reliability of the bit estimates and the second generating a decoded bit value from the improved estimates. If tandem decoders are used, it may also be advantageous to provide error protection for the transmitted parity bits.

BRIEF DESCRIPTION OF THE DRAWINGS

FIG. 4b is a more detailed block diagram of the weighting factor generation circuitry 60 of FIG. 4a;

DETAILED DESCRIPTION OF THE INVENTION

Figure 1:
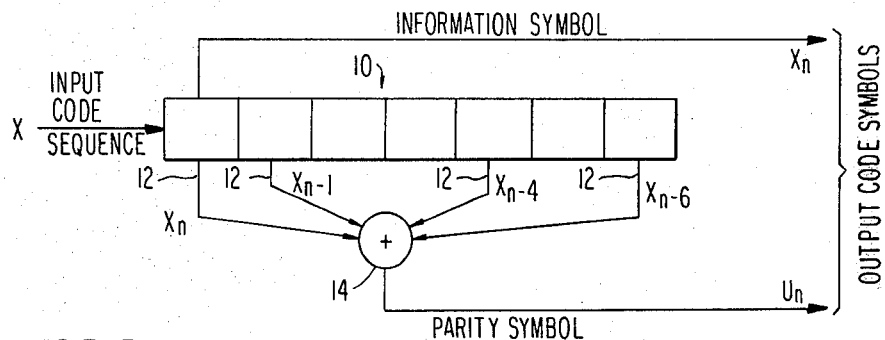
FIG. 1 is a brief block diagram of a conventional TDL encoder for data of a self-orthogonal convolutional code.

A new technique of threshold decoding will be described that is called Reliability Majority Decoding, or RMD. In RMD, the soft decisions are used to determine reliability weightings for each of the J+1 independent estimates on each information bit. The estimates are obtained solely from the most significant digits of the soft-detected symbols. Hence each estimate is actually based upon hard decisions. Consequently, the soft detection is employed only for the purpose of reliability assignments. Thus, RMD is a form of weighted majority decoding, with the weights used as reliability measures for each of the J+1 independent estimates.

In the discussion of RMD, $E_{no}$ will be used to denote the detection estimate for the nth information bit $X_n$. $E_{nj}$, $j=1$ to J, will be used to denote the other J estimates of $X_n$. Each of these other estimates is identical to the conventional parity check except that $X'_n$ is missing from the mod-2 sum. The prime is used to designate detected values of code symbols, as opposed to the transmitted values. Note that mod-2 addition is equivalent to substraction, and each estimate could therefore be obtained by adding the detected value $X'_n$ to a corresponding parity check $C_{nj}$:

$$E_{nj} = C_{nj} + X'_n$$

Because the weighting coefficient is based upon the individual terms that make up $E_{nj}$, the preceding equation will be expanded into its equivalent terms in RMD.

In RMD, threshold decoding is performed after the $J+1$ estimates $E_{nj}$, $j=0$ to J, of each information bit $X_n$ are appropriately weighted. The weighting coefficient $W_{nj}$ for each $E_{nj}$ is based upon the reliability of the estimate as determined from observing the soft-detection levels of all symbols that are used in the mod-2 sum to form the estimate. Note that for binary code symbols, each $E_{nj}$ can take on only two possible values, 1 and 0. Hence, in threshold decoding, weighted majority decisions will be made as follows:

$$\hat{X}_n = \begin{cases} 1 \text{ if } \lambda_1 > \Gamma \\ 0 \text{ if } \lambda_2 < \Gamma \end{cases}$$

where the metric $\lambda_1$ and the metric threshold $\Gamma$ are defined by:

$$\lambda_1 = \sum_{j=0}^{J} w_{nj} E_{nj} \quad (2)$$

$$\Gamma = \frac{1}{2} \sum_{j=0}^{J} w_{nj} \quad (3)$$

Now the major consideration is the determination of a useful reliability measure that may be obtained fairly easily from the soft-detected code symbols. Correlation of all terms in the mod-2 sum for $E_{nj}$ to their hard-detected values could be used to obtain the weighting coefficient $w_{nj}$. However, correlation would allow the terms in $E_{nj}$ with high reliability (better than average voltage levels because of constructive noise) to offset terms with low reliability (as the result of destructive noise). It will be easily appreciated that the reliability of each $E_{nj}$ is determined primarily by those terms which have low individual reliabilities. These low-reliability terms are those for which destructive noise has caused the received voltage level to lie near the midpoint between the nominal levels for logical "1" and logical "0". Basically, reliability can be thought of as a fraction with a range of 0 to 1 that indicates the certainty of an estimate. In practice it may be useful to scale the range from 0 to 7, etc., but the idea is based upon fractional reliability.

On a rough basis, if two unreliable terms have individual reliability factors of $w_1$ and $w_2$, then the effective reliability w of the two terms is the product, $w_1 w_2$, of their individual reliabilities. Therefore, in RMD, the reliability of each estimate is determined from the product of reliability factors of the terms that are used to obtain the estimate. Some terms may be quantized into the highest reliability levels, which would indicate near certainty of the decisions. It is thus only necessary to base the reliability upon terms of low reliability. If there are only a few terms (such as 8 or less) in an estimate, perhaps it will suffice to use the reliability number of the worst term. For estimates obtained from many terms, however, good decoding performance may require the weighting to be based upon the product of the reliability terms for several (2, 3, or 4) of the least-reliable terms.

The number m of terms in an estimate is a function of the code rate as well as the number J of parity checks for a self-orthogonal convolutional code. If the code rate is $(n-1)/n$, then the number of terms in each estimate $E_{nj}$ (other than the detected bit itself, which constitutes $E_{no}$) is given by:

$$m = J(n-1)$$

Thus, $m=4$ for a code rate $\frac{1}{2}$ when $J=4$. However, with $J=4$, a code rate of $\frac{7}{8}$ results in $m=28$. When there are such a large number of terms in an estimate, the weighting could be based upon more than just the two least-reliable terms. The total weighting should then be based upon the product of individual reliability weights for the most-unreliable terms that are used. Thus, in general, $$w = \sum_{i=1}^{I} w_i$$

where the weighting is based upon the I most-unreliable terms. Because the derivation is approximate, computer simulations are necessary to determine the number of most-unreliable terms that must be used for weighting in order to yield good decoding performance for a particular code. In fairly simple codes (for example, $m \leq 8$), $I=1$ may suffice for near-optimum performance. In a high-rate code for which $m \geq 20$, however, values of I from 2 up to 4 may be required.

Soft detection will be used to quantize each detected code symbol into L quantization levels. For implementation simplicity, the quantization levels will be equally spaced by a quantization step $\Delta v$. The optimum $\Delta v$ will be determined for the codes of interest as a function of both $E_b/N_o$ and L. As in Viterbi decoding, it is expected that $L=8$ quantization levels for RMD will suffice to approach the decoding performance that could be obtained with infinite quantization. Two different mappings may be used for the detected code symbols, as follows:

| Voltage Level | Quantization Method A | Quantization Method B |
|---|---|---|
| L | L − 1 | +(L − 1) |
| L − 1 | L − 2 | +(L − 3) |
| L − 2 | L − 3 | +(L − 5) |
| ... | ... | ... |
|  |  | +1 |
|  |  | −1 |
| ... | ... | ... |
| 3 | 2 | −(L − 5) |
| 2 | 1 | −(L − 3) |
| 1 | 0 | −(L − 1) |

For either form of quantization, Method A or Method B, the reliability factors for individual terms are proportional to the distances from the voltage or origin of the midpoints of their quantized detection levels. Consequently, the appropriate relative reliability weightings are equal to the absolute values of the quantized voltage levels for method B. The following is an example of the quantized voltage levels and the reliability weightings for 8-level (L=8) soft-detection.

| Detection Level | Quantized Voltage Method A | Quantized Voltage Method B | Reliability Factors |
|---|---|---|---|
| 8 | 7 | +7 | 7 |
| 7 | 6 | +5 | 5 |
| 6 | 5 | +3 | 3 |
| 5 | 4 | +1 | 1 |
| 4 | 3 | −1 | 1 |
| 3 | 2 | −3 | 3 |
| 2 | 1 | −5 | 5 |
| 1 | 0 | −7 | 7 |

In RMD, the weighting coefficients for the J+1 estimates of each information bit are, of course, proportional to the products of the weights for their I least-reliable terms. In the majority decoding decision, a logical "1" is output for $X_n$, the nth information bit, only if the weighted sum of the $E_{nj}$ estimates with values of "1" exceeds the weighted sum of the $E_{nj}$ estimates with "0" values. Thus, in general the decoder decision is based upon the following inequality.

$$\sum_{j=0}^{J} w_{nj} E_{nj} \lessgtr \sum_{j=0}^{J} w_{nj} \overline{E}_{nj}$$

where $\overline{E}_{nj}$ is the binary complement of $E_{nj}$, the jth estimate of $X_n$. The equation may be manipulated into the usual threshold test:

$$\lambda_1 \lessgtr \Gamma$$

where the metric $\lambda_1$ and its threshold $\Gamma$ are defined by equations (2) and (3), respectively.

In majority-logic decoding with uniform weighting, the threshold $\Gamma$ is a constant, $(J+1)/2$. It may be seen, however, that $\Gamma$ is a variable for RMD which must be calculated independently for each information bit that is to be decoded. Fortunately, it is possible to avoid this additional computational requirement. For the RMD case, a new weighting function $Z_{nj}$ is obtained that is equal to the old weighting function multiplied by 1 or −1, dependent upon the value of $E_{nj}$. For $E_{nj}=1$, the multiplier is +1, and for $E_{nj}=0$, the multiplier is −1. Thus, $$Z_{nj} = W_{nj}(2E_{nj}-1)$$

where $E_{nj} = 0$ or 1. With this new weighting function Z, the new metric is simply the algebraic sum of the J+1 weights, and the new threshold is a constant equal to zero. Hence the majority test is:

$$\lambda \lessgtr \Gamma$$

where $$\lambda = \sum_{j=0}^{J} Z_{nj}$$

$$\Gamma = 0$$

In general, for RMD the weighting coefficient $W_{nj}$ of the jth of (j+1) estimates is the product of the individual reliability factors for the I terms in $E_{nj}$ of least reliability. If I=1, the weighting is identical to the reliability of the single worst term. Consider such a case when the detector output is quantized linearly by method A from 0 to L−1. For this case, $$w_{nj} = \begin{cases} 2\left(v_{nj} - \frac{L-1}{2}\right) & \text{for } E_{nj} = 1 \\ 2\left(\frac{L-1}{2} - v_{nj}\right) & \text{for } E_{nj} = 0 \end{cases}$$

where $V_{nj}$ is the quantized voltage level for the worst term in the jth estimate of $X_n$, the nth information bit. Now note that the majority test is:

$$\sum_{j=0}^{J} \left(v_{nj} - \frac{L-1}{2}\right) E_{nj} = \sum_{j=0}^{J} w_{nj}E_{nj} \lessgtr \sum_{j=0}^{J} w_{nj}\overline{E}_{nj} =$$

$$\sum_{j=0}^{J} \left(\frac{L-1}{2} - v_{nj}\right) \overline{E}_n$$

This expression may be arranged to yield:

$$\sum_{j=0}^{J} v_{nj}(E_{nj} + \overline{E}_{nj}) \lessgtr \sum_{j=0}^{J} ((L-1)/2)(E_{nj} + \overline{E}_{nj})$$

But the sum of binary complements is identically unity:

$$E_{nj} + \overline{E}_{nj} = 1$$

Thus a new metric $\lambda$ and its threshold $\Gamma$ may be used to perform the majority test $$\lambda \lessgtr \Gamma$$

where $$\lambda \triangleq \sum_{j=0}^{J} v_{nj}$$

$$\Gamma \triangleq \left(\frac{J+1}{2}\right)(L-1)$$

Note that constructive noise on a symbol in an estimate cannot overcome the poor reliability of another term with destructive noise. Therefore, there is no great purpose in a quantizing range that extends beyond the nominal voltage level in the absence of noise. Thus, in the absence of noise, a term will have a voltage level that is classified into the highest reliability category of 2L−1, where there are L quantization levels. Hence, in the absence of noise, the winning margin for a majority decision will have its maximum value of (L−1)(J+1)/2. This margin is proportional to one-half of the minimum Hamming distance of d=J+1 for the code. A correct decision can always be made as long as the margin is not reduced to zero or less by destructive noise. Received symbols with voltage levels that fall into other than the most reliable class can be thought of as causing fractional errors, with a linear scale of 0 to 1 that spans a reliability range of $+1$ to $-1$, where $-1$ indicates an apparently reliable value of the wrong polarity and $+1$ is a reliable estimate of the correct polarity. The correct decision will have a winning majority in RMD as long as the sum of fractional errors does not exceed $d/2$. Hence RMD may be interpreted as one form of generalized minimum-distance decoding.

As an illustration of RMD, the same code previously used to illustrate majority-logic decoding will be used. For the code of rate $\frac{1}{2}$ and constraint length $K=7$, there are $J=4$ parity checks. As shown previously, the four parity checks on the nth information bit are given by equation (1).

Figure 4A:
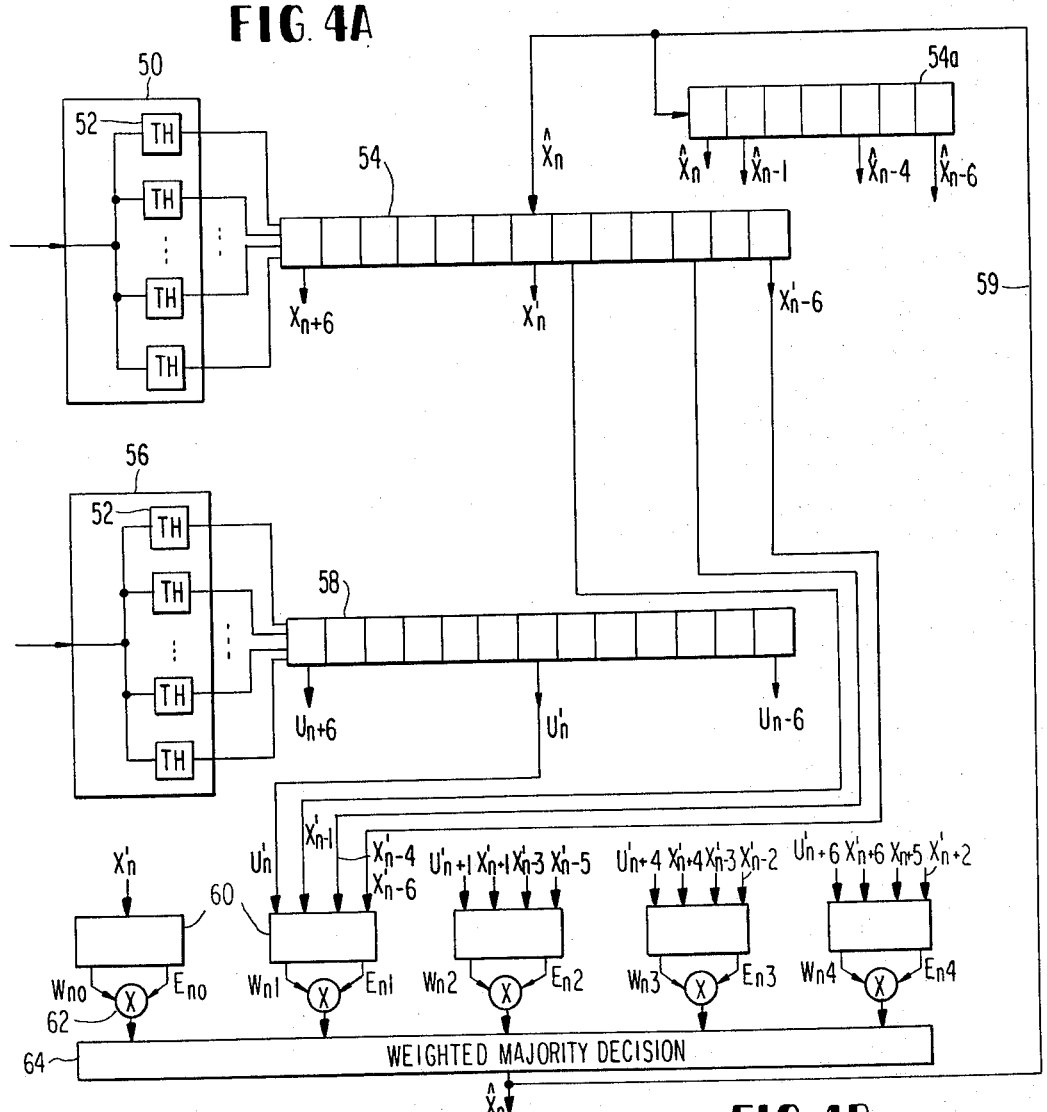
FIG. 4a is a block diagram of one example of a reliability majority decoder according to the present invention.

In equation (1) the mod-2 addition of hard-detected terms is used to obtain each of the estimates of $X_n$. Soft decisions on the terms in each estimate $E_{nj}$ are used to obtain a reliability weighting function. FIG. 4a is a block diagram of the RMD decoder for the code example. The information symbols ar received in a soft detector 50 for quantization. In its most basic form, the soft detector 50 may include a plurality of threshold detectors 52 with various threshold levels between the two levels (i.e. the "0" and "1" levels) of the binary signal. The parallel outputs from the threshold detectors 52 constitute a multibit binary number identifying the magnitude of the soft-detected symbol.

The multi-bit numbers for successive symbols are supplied to the input of a complex shift register 54 having the number of stages necessary to hold all of the information symbols for estimates $E_{no}-E_{n4}$. A similar soft detector 56 and shift register 58 are provided for the received parity symbols $U'$, although it will be appreciated that shift register 58 need not be as long as register 54.

The estimate and weighting factor generation circuitry 60 combines the most significant bit of each detected symbol to obtain an estimate $E_{nj}$. Since the estimate is based only on the most significant bit of each of the symbols, it is effectively based on "hard" detection of the symbols. The remaining less significant bits of each symbol are decoded to determine a reliability factor for each symbol, and the estimate $E_{nj}$ will be assigned a weighting factor $W_{nj}$ based upon the individual reliabilities of the symbols used in obtaining the estimate. This estimate $E_{nj}$ and corresponding weighting factor $W_{nj}$ are multiplied in a multiplier 62 to achieve a weighted estimate which is supplied to a weighted majority decision circuit 64.

In the decision circuit 64, the weighted estimates can be combined and the combined values subjected to a threshold detection, e.g. at a threshold equal to the midpoint between the two values of the binary signal. If the combined estimate is above the threshold, $\hat{X}_n$ will be decoded as a binary "1". If it is below the threshold, $\hat{X}_n$ will be a binary "0". It is seen that the decoder differs considerably from the usual syndrome type of majority-logic implementation for hard-detected code symbols. An optional feedback is shown at 59 by which the detected value of $X'_n$ in register 54 is replaced with the decoded value $\hat{X}_n$ of highest reliability classification. Alternatively, due to the difficulty of modifying the contents of register 54, a separate feedback register 54a may be provided with appropriate taps coupled to weighting factor circuits 60. All terms in register 54a would, of course, be assigned the highest reliability.

Figure 4B:
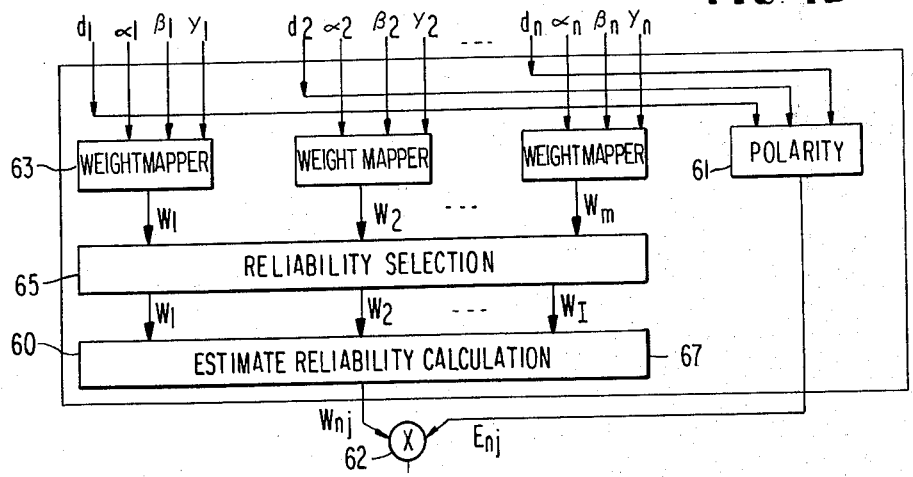

FIG. 4b is a brief block diagram of the contents of estimate and weighting factor generation circuitry 60 in a system in which the reliability of each estimate is to be based upon the individual reliabilities of some number l of the least reliable of the m terms used to obtain the estimate. The most significant bits of the soft-detected symbols are supplied to a polarity decision circuit 61 which may consist of a modulo-2 adder and a comparator which assigns a $+1$ if the mod-2 sum of the most significant bits is 1, and a $-1$ if the mod-2 sum is zero. The output of the polarity circuit 61 is a symbol estimate based upon hard-detected symbol values. While the most significant bit of each soft decision may be merely a polarity bit, the remaining bits indicate the magnitude of the detected symbol, and these least significant bits are supplied to weight mapper 63, e.g., a decoder, each mapper 63 providing as an output a reliability signal in accordance with the value of the least significant bits received as inputs. Thus, for the m terms used in obtaining an estimate, m corresponding reliability signals are supplied to a reliability selection circuit 65.

The reliability selection circuit 65 receives these m reliability signals and arranges the reliability signals in numerical order from highest to lowest, or lowest to highest, and provides l output signals corresponding to the l lowest reliability signals. This could be done, for instance, by simple logic circuitry which would pass only those signals $W_i$ falling in the lowest reliability class until l signals have been passed. If l signals are not passed on this level, signals of the next lowest reliability class would be passed, and so forth, until the proper number of reliability signals have been obtained. Alternatively, a simple microprocessor could be used to accomplish the same function. These reliability signals $W_1 - W_l$ are provided to an estimate reliability calculation circuit 67 which calculates a weighting factor $W_{nj}$ which corresponds to the reliability of the output of polarity decision circuit 61. These two output signals are then multiplied in multiplier 62 to achieve a weighted estimate as described above for the jth weighted estimate of the nth information symbol $X_n$. There will be $d = J + 1$ circuits for calculating the d weighted estimates upon which a weighted majority decision is made of $X_n$.

The contents of calculation circuit 67 may constitute merely a multiplication circuit.

As discussed by Massey, APP (a posteriori probabilistic) decoding is optimum with respect to utilizing channel information (received voltage levels of signal plus noise) to weight the $J+1$ estimates on each information bit so as to minimize the decoder error rate. However, the weighting algorithm for APP decoding is too complicated for practical implementation for other than low-speed digital communications. RMD employs a suboptimum weighting that can be implemented much simpler than APP weighting.

Simulation testing on a FEC convolutional code of rate $\rho = (n-1)/n = \frac{1}{2}$ and minimum distance $d = J + 1 = 5$, where $J = 4$ is the number orthogonal parity checks on each information bit, has shown significant decoding improvement for 3-digit or 8-level quantization. The code can be generated from the encoder of FIG. 1, with a constraint length $K = 7$. Symbol weighting is as shown in the following table.

| Received Voltage Level | Symbol Weighting |
|---|---|
| +0.9 to ∞ | 7 |
| +0.6 to 0.9 | 5 |
| +0.3 to 0.6 | 3 |
| 0.0 to 0.3 | 1 |
| −0.3 to 0.0 | 1 |
| −0.6 to −0.3 | 3 |
| −0.9 to −0.6 | 5 |
| −∞ to −0.9 | 7 |

The symbol weighting represents a reliability number times a constant, which is 7 in this case. Thus, weightings of 7, 5, 3, and 1 correspond to reliability numbers of 7/7, 5/7, 3/7, and 1/7 respectively. For an FEC code of rate $\rho = \frac{1}{2}$ and distance d=5, there are J=4 terms used in a mod-2 sum to obtain each of J=4 estimates of a bit from parity checks. The weighting factor for each estimate is based upon the product of reliability numbers for some subset of the 4 terms. This subset contains the terms of least reliability. As an example, consider a weighting function based upon the three least-reliable terms. Let W represent the weighting function for an estimate in which the three least-reliable terms have individual weighting factors of $W_1$, $W_2$, and $W_3$. Then, $$W = 7[(W_1/7)(W_2/7)(W_3/7)]$$

Thus, in general, for weighting based upon the M least-reliable terms, $$W = 7 \sum_{m=1}^{M} (W_m/7)$$

With each estimate weighted, the decoder decision is based upon a weighted majority. Including the received information bit (corrupted by noise), there are d=J+1 independent estimates on this bit. Let $\Gamma_j$, for j=0 to j=J, denote a metric for each of the J+1 estimates. With a positive voltage used for a logical "1" and a negative voltage for a logical "0", the polarity $\Xi = \pm 1$ for each estimate can be used to obtain $\Gamma$ from the product of $\Xi$ and W.

$$\Gamma = \Xi W$$

Then a 1, 0 decoder decision can be based upon the polarity of the sum of the metrics for the estimators. Let $X_n$ denote the information bit that is being decoded. The decision scheme is:

$$\sum_{j=0}^{J} \Gamma_j \geq 0 \longrightarrow X_n = \text{"1"}$$

$$\sum_{j=0}^{J} \Gamma_j < 0 \longrightarrow X_n = \text{"0"}$$

As a reference for determining the improvement afforded by soft detection for reliability weighting, the performance was first obtained for the hard-detection case. With hard detection, all estimates were given equal weighting, which is the classical method of majority-logic decoding. Conventional hard-detection results were obtained in the computer simulations for all three variations: no feedback or definite (DEF), partial feedback (PFB), and the usual decision feedback (DFB).

With respect to the error rate $P_I(e)$ of the input to the decoder, the signal-to-noise ratio (SNR) per binary code symbol is 3 dB less than $E_b/N_o$, the SNR per information bit, because the code rate of 0.5 produces two code symbols per information bit. Therefore, $P_I(e)$ is worse than the theoretical probability $P_U(e)$ of error for uncoded communications. In the following Table I the results for computer simulations of the rate=0.5 experimental code are given for the case of hard-detected code symbols. The simulation models the channel disturbance as additive white Gaussian noise. In the table, $N_B$ denotes the length of the simulation run measured in information bits. The bit error rate for the decoder output decisions is denoted by $P_b(e)$.

TABLE I

Majority-Logic Decoding Performance For Experimental Code On Hard-Detected Code Symbols

| $E_b/N_o$(dB) | $N_B$ (bits) | Input Error Rate $P_I(e)$ | DEF | Output Error Rate $P_b(e)$ PFB | DFB |
|---|---|---|---|---|---|
| 5.0 | 50,000 | $3.72 \times 10^{-2}$ | $1.29 \times 10^{-2}$ | $1.05 \times 10^{-2}$ | $1.11 \times 10^{-2}$ |
| 6.0 | 100,000 | $2.29 \times 10^{-2}$ | $3.59 \times 10^{-3}$ | $2.90 \times 10^{-3}$ | $3.04 \times 10^{-3}$ |
| 7.5 | 250,000 | $9.04 \times 10^{-3}$ | $2.72 \times 10^{-4}$ | $2.24 \times 10^{-4}$ | $1.80 \times 10^{-4}$ |
| 8.0 | 750,000 | $5.91 \times 10^{-3}$ | $7.87 \times 10^{-5}$ | $7.60 \times 10^{-5}$ | $6.53 \times 10^{-5}$ |

With soft-detection, the decoder performance is influenced both by the range and resolution of the received voltage levels that are given by quantization. With $V_Q$ used to denote the absolute voltage of the outer quantization levels and L the number of quantization levels, the decoder error rate is a function of both $V_Q$ and L, as well as $E_b/N_o$. Ordinarily, 3-bit quantization or L=8 is sufficient in soft detection to yield results almost as good as for large L. As an example, consider the error rates when $E_b/N_o=5$ dB and the outer range of the quantizer is $V_Q=1.0$. With the weighting of each estimate based upon the least-reliable term, $P_b(e)=2.47\times10^{-3}$ was obtained with definite RMD decoding when L=8. Then, 4-bit quantization was used to yield L=16, and the decoder performance was improved only marginally to $P_b(e)=2.33\times10^{-3}$. It was decided at this point to employ only 3-bit quantization (L8) in all later computer simulations, with $V_Q$ being the only quantization variable.

Tests were also performed to determine the sensitivity of the decoder performance to the number of terms included in the RMD weighting calculation. There are J=4 total terms in each of the estimates obtained from parity checks and a single term in the estimate obtained from the received information symbol. The reliability weighting of an estimate obtained from a parity is based upon the product of reliability factors for the I least-reliable of J terms in the parity check, excluding the term that is being estimated. Thus, I can be 1,2,3 or 4 for the test code, with J=4. It was found for this code that increasing I yields only a slight improvement in decoder performance, at best. A threshold of $V_Q=0.75$ was approximately optimum for minimizing $P_b(e)$ irrespective of the value of I when $E_b/N_o=5.0$ dB. In a computer run of $N_B=50,000$ information bits, $P_b(e)$ had values of $2.72\times10^{-3}$, $2.58\times10^{-3}$, $2.66\times10^{-3}$, and $2.66\times10^{-3}$ for I values of 1, 2, 3, and 4, respectively, when $E_b/N_o=5.0$ dB and $V_Q=0.75$.

Figure 5:
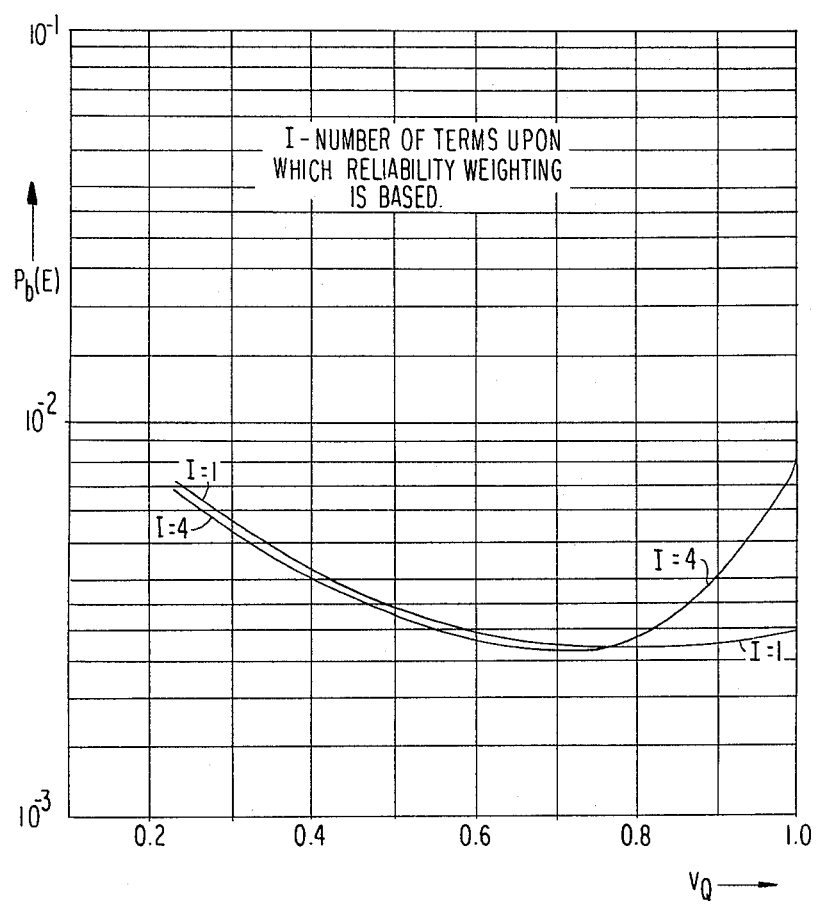
FIG. 5 is a graph of the sensitivity of reliability majority decoding performance to quantizer scaling when $E_b/N_o = 5$ dB.

Although $P_b(e)$ is minimized for approximately the same quantization threshold $V_Q$ irrespective of I, the sensitivity of $P_b(e)$ to $V_Q$ is quite different as I is varied. For reliability weighting based upon a single worst term, the case of $I=1$, the decoder error rate $P_b(e)$ is quite insensitive to variations of the quantization range about the optimum threshold of $V_Q$. For larger I, the reliability weighting is the product of reliability factors. A high quantization range, large $V_Q$, would result in multiple terms falling below the threshold of maximum reliability classification. Consequently, the product of reliability factors would be too small, and an estimate would sometimes be almost eliminated from consideration by the assignment of an extremely small weighting factor. With I large, however, the decoder performance is quite insensitive to reductions of $V_Q$ below its optimum value. For the test code with four terms per parity check, the sensitivity of the decoder performance to $V_Q$ was tested for $I=1$ and $I=4$. The results are included both in the following Table II and in FIG. 5 at the particular $E_b/N_o$ value of 5.0 dB.

TABLE II

Sensitivity To Quantization Scaling for RMD Decoding of Test Code When $E_b/N_o = 5.0$ dB

| | | | $P_b(e)$ | |
|---|---|---|---|---|
| Scaling Constant $V_Q$ | Length $N_B$ of Simulation | $P_I(e)$ | Weighting based upon $I = 1$ term | Weighting based upon $I = 4$ terms |
| 0.25 | 50,000 | $3.72 \times 10^{-2}$ | $6.60 \times 10^{-3}$ | $6.44 \times 10^{-3}$ |
| 0.40 | 50,000 | $3.72 \times 10^{-2}$ | $4.04 \times 10^{-3}$ | $3.98 \times 10^{-3}$ |
| 0.50 | 50,000 | $3.72 \times 10^{-2}$ | $3.44 \times 10^{-3}$ | $3.22 \times 10^{-3}$ |
| 0.60 | 50,000 | $3.72 \times 10^{-2}$ | $3.00 \times 10^{-3}$ | $2.92 \times 10^{-3}$ |
| 0.70 | 50,000 | $3.72 \times 10^{-2}$ | $2.70 \times 10^{-3}$ | $2.64 \times 10^{-3}$ |
| 0.80 | 50,000 | $3.72 \times 10^{-2}$ | $2.72 \times 10^{-3}$ | $2.76 \times 10^{-3}$ |
| 0.90 | 50,000 | $3.72 \times 10^{-2}$ | $2.80 \times 10^{-3}$ | $4.20 \times 10^{-3}$ |
| 1.00 | 50,000 | $3.72 \times 10^{-2}$ | $2.88 \times 10^{-3}$ | $8.28 \times 10^{-3}$ |

As $E_b/N_o$ is increased, the noise does not result in low voltage levels as often as for small $E_b/N_o$. Consequently, the optimum threshold $V_Q$ for the quantization scale is increased somewhat as $E_b/N_o$ increases. Whereas a scaling factor of $V_Q=0.75$, approximately, is optimum when $E_b/N_o=5.0$ dB, the optimum value of $V_Q$ increases to about 1.0 when $E_b/N_o$ was raised to 6.0 dB. Table III indicates the sensitivity of the decoder performance to $V_Q$ when $E_b/N_o=6.0$ dB.

TABLE III

Sensitivity To Quantization Scaling for RMD Decoding of Test Code When $E_b/N_o = 6.0$ dB

| Scaling Constant $V_Q$ | Length $N_B$ bits for Simulation | Decoder Input Error Rate $P_I(e)$ | Decoder Output Error Rate $P_b(e)$ When $I = 1$ |
|---|---|---|---|
| 0.8 | 30,000 | $2.37 \times 10^{-2}$ | $4.67 \times 10^{-4}$ |
| 0.9 | 30,000 | $2.37 \times 10^{-2}$ | $4.34 \times 10^{-4}$ |
| 1.0 | 30,000 | $2.37 \times 10^{-2}$ | $4.01 \times 10^{-4}$ |
| 1.1 | 30,000 | $2.37 \times 10^{-2}$ | $4.67 \times 10^{-4}$ |

Figure 6A:
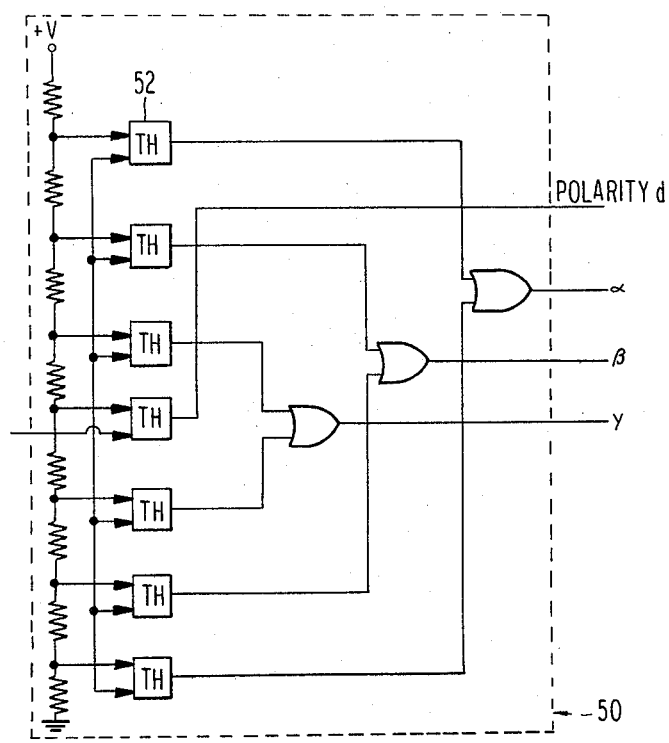
FIG. 6a is a schematic of one example of a soft detector usable in the present invention.

As is clear from the above results, it is sometimes desirable to utilize only the least reliable term in an estimate to calculate a weighting factor for that estimate. With the use of the quantization scheme of this invention, it would be fairly simple to implement reliability weighting based upon the least-reliable term of each estimate of the information bit. First, the most-significant binary digit of the quantizer word would indicate the polarity of the received voltage, as would be given by hard detection. Then, for $L=2$ R levels of quantization, corresponding to R reliability levels, R-1 binary digits can be used to represent the reliability level of the voltage. Let the first of the R-1 binary digits denote whether or not the voltage falls within the highest reliability classification. The next digit can represent whether or not the voltage falls within one of the two highest reliability levels. Similarly, the third digit denotes whether or not the voltage falls within one of the top three reliability levels, and so on. Table IV illustrates the quantization scheme for 8-level soft detection, and FIG. 6a illustrates a configuration for threshold detectors 52 which would yield such a quantization scheme.

TABLE IV

Proposed Quantization Scheme For Reliability Weighting Based on Worst Term

| | | Detection Vector | | | |
|---|---|---|---|---|---|
| Voltage Classification | Reliability Classification | Polarity d | Reliability $\alpha$ | $\beta$ | $\gamma$ |
| 7 | 7 | 1 | 1 | 1 | 1 |
| 6 | 5 | 1 | 0 | 1 | 1 |
| 5 | 3 | 1 | 0 | 0 | 1 |
| 4 | 1 | 1 | 0 | 0 | 0 |
| 3 | 1 | 0 | 0 | 0 | 0 |
| 2 | 3 | 0 | 0 | 0 | 1 |
| 1 | 5 | 0 | 0 | 1 | 1 |
| 0 | 7 | 0 | 1 | 1 | 1 |

Both the polarity and reliability of each estimate are based upon the quantization vectors of all terms in the estimate, with the reliability being determined by the least reliable of all terms in the estimate. The polarity is determined by the modulo-2 sum of the hard-detection or polarity portion of the terms of the estimate. After the modulo-2 sum is obtained, the result is mapped into polarity by the interpretation of a logical 1 as positive and logical 0 as negative. The reliability weighting applied to the polarity is determined from the R-1 digits of each term in the estimate. Assume that m terms (received code symbols) are used to form an estimate of an information bit. By connecting the corresponding digits of the reliability portions of the detection vectors for the m terms to AND logic circuits, the output of each of the R-1 AND circuits will be a 1 only if all inputs have 1 values; otherwise the output is a zero. The vector obtained from the outputs of the R-1 AND circuits represents the reliability of the estimate. Note that this vector will be identical to the reliability portion of the detection vector for the least-reliable of the m terms. The proposed scheme for determining the weight classification of an estimate based upon the least-reliable term is illustrated in FIG. 6b.

Figure 6B:
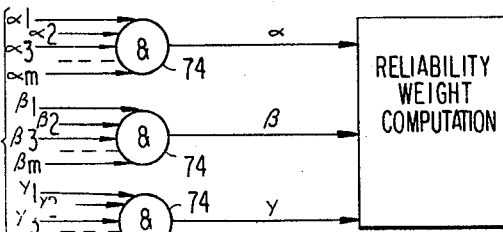
FIG. 6b is a diagram of a novel technique for determining reliability weighting based upon the least-reliable term.

In FIG. 6b, the polarity bits $d_1-d_m$ for the m terms used in an estimate are logically summed in a mod-2 adder 70 to obtain an estimate that the symbol is either a "1" or a "0". A polarity assignment circuit 72 then provides either a +1 or −1 output depending upon the output of adder 70. The output of polarity assignment circuit 72 constitutes $E_{nj}$ in FIG. 4.

The corresponding significant bits of the soft detection values are then combined in AND gates 74, and it will be apparent that the combined output of the gates 74 would be identical to the reliability vector of the least reliable term used in the estimate. Reliability weight computation circuit 76 decodes the combined output of gate 74 and outputs a corresponding weighting factor. This weighting factor and the output of polarity assignment circuit 72 are combined in multiplier 62 to achieve a weighted estimate to be supplied to circuit 64 in FIG. 4.

Only definite decoding of the test code was tested in a computer simulation of RMD decoding. Feedback of previous decoder decisions could be used to increase the reliability of some terms in the d-1=J estimates of each bit that are obtained from parity checks. With feedback employed, the reliability of the feedback terms in each estimate should be given the highest classification irrespective of their reliability assignments obtained from soft detection.

It will be appreciated from a comparison of Tables I and II that RMD provides significant improvements in error rate. In some cases, performance can be improved by utilizing the reliabilities of a plurality of least reliable terms rather than the single least reliable term as in U.S. Pat. No. 3,805,236 to Battail. Further, if only a single least reliable term is used to derive a weighting factor, the simple and inexpensive logic circuitry according to the present invention, shown in FIG. 6b, can be used to accomplish this.

The application of RMD to a more complex code will now be explored.

Figure 7:
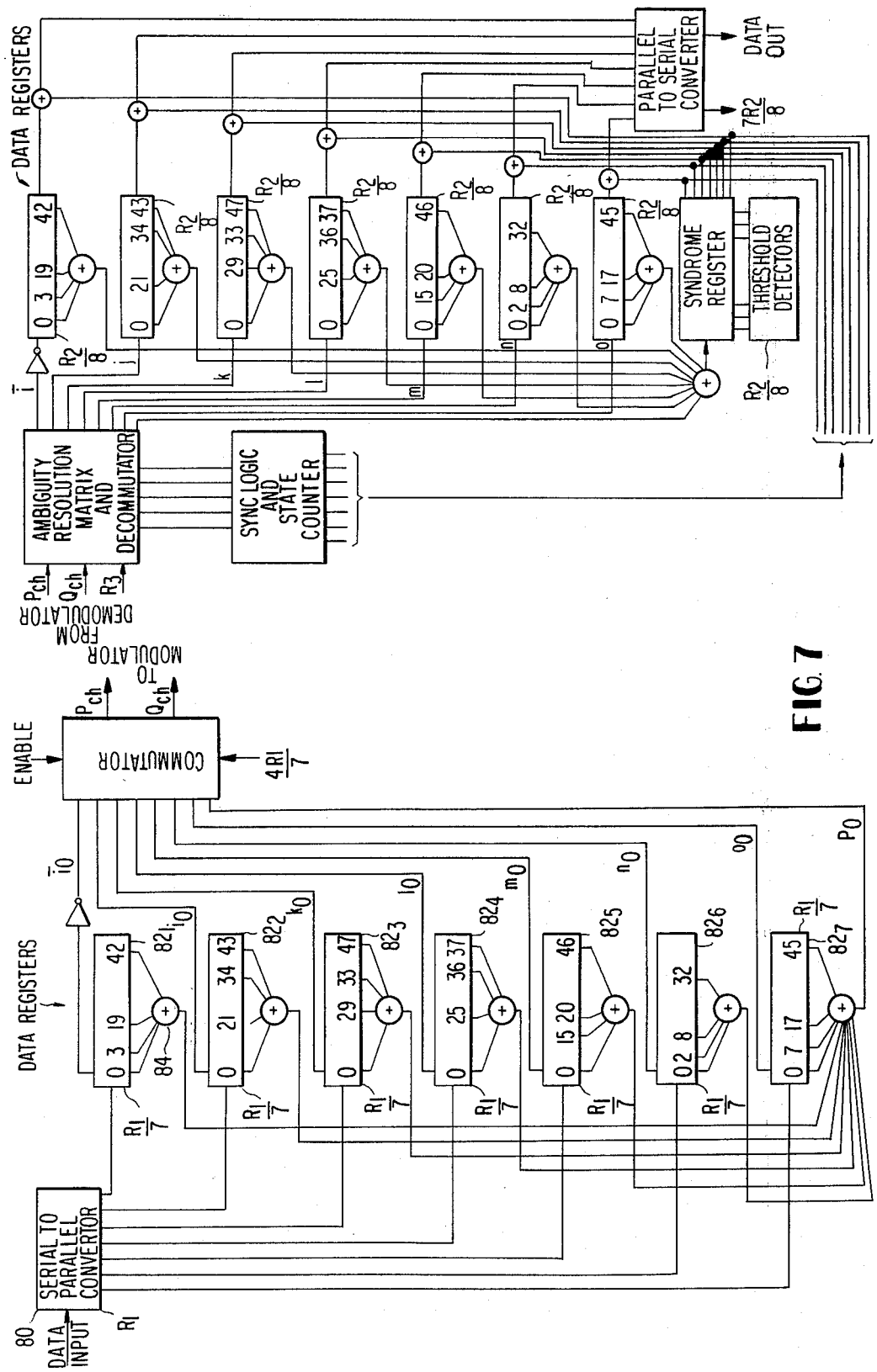
FIG. 7 is a block diagram of a conventional encoder/decoder for a high-rate ($\rho = \frac{7}{8}$) FEC code.

The code chosen for this discussion is of high rate, $\frac{7}{8}$, and has a long constraint length of 336 information bits. As shown in FIG. 7, the code produces J=4 parity checks on each information bit. Therefore, the code distance is d=5, the same as for the previous experimental code. Because of the high code rate of $p=0.875$, the SNR per code symbol is only 0.58 dB less than $E_b/N_o$, the SNR per information bit. This degradation is much smaller than the 3 dB rate loss for the experimental code with rate 0.5. Consequently, the performance is significantly better for the high rate code even though the numbers of parity checks and code distances are identical for both codes.

At the encoder the input consists of a group of seven information bits provided in parallel from converter 80, which are each fed to a separate shift register 82 of length 48. The output of the encoder for the systematic code of rate $\frac{7}{8}$ is a group of 8 binary code symbols, consisting of the 7 information symbol plus a single parity symbol. The parity symbol is obtained from a modulo-2 sum, via adders 84, of 28 terms, 4 terms from each of the 7 parallel shift registers. Note the long constraint length of 7×48 bits that is required to provide only J=4 orthogonal parity equations on each information bit when the code has such a high rate. Therefore, the code is fairly complicated even though the number of parity checks is not great. The encoder tap connections on the 7 registers may be specified for the $\frac{7}{8}$ code by the 7 sets of location numbers as follows.

| Register $82_1$ | 0 | 3 | 19 | 42 |
|---|---|---|---|---|
| Register $82_2$ | 0 | 21 | 34 | 43 |
| Register $82_3$ | 0 | 29 | 33 | 47 |
| Register $82_4$ | 0 | 25 | 36 | 37 |
| Register $82_5$ | 0 | 15 | 20 | 46 |
| Register $82_6$ | 0 | 2 | 8 | 32 |
| Register $82_7$ | 0 | 7 | 17 | 45 |

It is important to obtain an accurate estimate of decoder performance on hard decisions because this performance measure will be utilized as the standard by which to determine the improvement in coding gain provided by soft detection. It is possible to compute the exact performance of the decoder for definite decoding, the case of no feedback or syndrome reset. Hence, the curves 85 and 87 in FIG. 8 of $P_b(e)$ versus $E_b/N_o$ were first obtained as a guide for judging later simulation results.

In the first tests of decoding that utilized soft detection, the reliability weighting of each estimate was obtained from the product of individual reliability numbers of the I least-reliable terms in the estimate. For these simulations of RMD decoding, results were obtained for I=1, 2, 3, 4, 5, 6, and 28. The m=28 value is, of course, the total number of terms in the modulo-2 sum obtained from each parity check for this code. Although the products of I reliability terms could result in many different weightings, the actual weighting was somewhat simplified by quantizing the product into r=4 levels of 1, 3, 5, and 7. Therefore, each of the estimates obtained from parity equations was given the same weighting set as the estimate obtained from the received information symbol. Because of the large number (m=28) of terms in each parity equation, however, estimates obtained from parity checks usually had low weightings, such as 1 or, at most, 3. The information symbol was typically at a higher reliability level than any of the J estimates obtained from parity equations.

A sensitivity test on quantization range or scaling factor $V_Q$ was performed at a $E_b/N_o$ of 5 dB. As seen from the following tabulations, the RMD performance was optimized at $V_Q=0.6$ when the weighting was based upon the single least-reliable term in an estimate. For the weighting based upon more than one term, the decoding performance was best at $V_Q=0.5$. These initial results were based upon simulation runs of only $N_b=5,000$ information symbols each, but the error statistics are here used only to roughly determine a good quantization scaling.

TABLE V

Sensitivity of RMD Performance to Quantization Scale for Soft-Detection When $E_bN_o = 5$ dB

| Quantizer Scaling $V_Q$ | Input Error Rate $P_I(e)$ | Output Error Rate $P_b(e)$ for Weighting Based on I Least-Reliable Terms I Values | | | | | | |
|---|---|---|---|---|---|---|---|---|
| | | 1 | 2 | 3 | 4 | 5 | 6 | 28 |
| 1.0 | $1.16 \times 10^{-2}$ | $7.13 \times 10^{-3}$ | $7.36 \times 10^{-3}$ | $7.36 \times 10^{-3}$ | $7.36 \times 10^{-3}$ | $7.36 \times 10^{-3}$ | $7.36 \times 10^{-3}$ | $7.36 \times 10^{-3}$ |
| 0.8 | $1.16 \times 10^{-2}$ | $5.52 \times 10^{-3}$ | $6.21 \times 10^{-3}$ | $6.21 \times 10^{-3}$ | $6.21 \times 10^{-3}$ | $6.21 \times 10^{-3}$ | $6.21 \times 10^{-3}$ | $6.21 \times 10^{-3}$ |
| 0.6 | $1.16 \times 10^{-2}$ | $4.83 \times 10^{-3}$ | $3.91 \times 10^{-3}$ | $4.37 \times 10^{-3}$ | $4.83 \times 10^{-3}$ | $4.83 \times 10^{-3}$ | $4.83 \times 10^{-3}$ | $3.68 \times 10^{-3}$ |
| 0.5 | $1.16 \times 10^{-2}$ | $6.21 \times 10^{-3}$ | $3.68 \times 10^{-3}$ | $4.14 \times 10^{-3}$ | $4.14 \times 10^{-3}$ | $4.14 \times 10^{-3}$ | $4.14 \times 10^{-3}$ | $4.14 \times 10^{-3}$ |

TABLE V-continued

Sensitivity of RMD Performance to Quantization Scale for Soft-Detection When $E_bN_o = 5$ dB

| Quantizer Scaling $V_Q$ | Input Error Rate $P_I(e)$ | Output Error Rate $P_b(e)$ for Weighting Based on I Least-Reliable Terms I Values | | | | | | |
|---|---|---|---|---|---|---|---|---|
| | | 1 | 2 | 3 | 4 | 5 | 6 | 28 |
| 0.4 | $1.16 \times 10^{-2}$ | $8.65 \times 10^{-3}$ | $4.21 \times 10^{-3}$ | $4.34 \times 10^{-3}$ | $4.34 \times 10^{-3}$ | $4.34 \times 10^{-3}$ | $4.34 \times 10^{-3}$ | $4.34 \times 10^{-3}$ |

Figure 8:
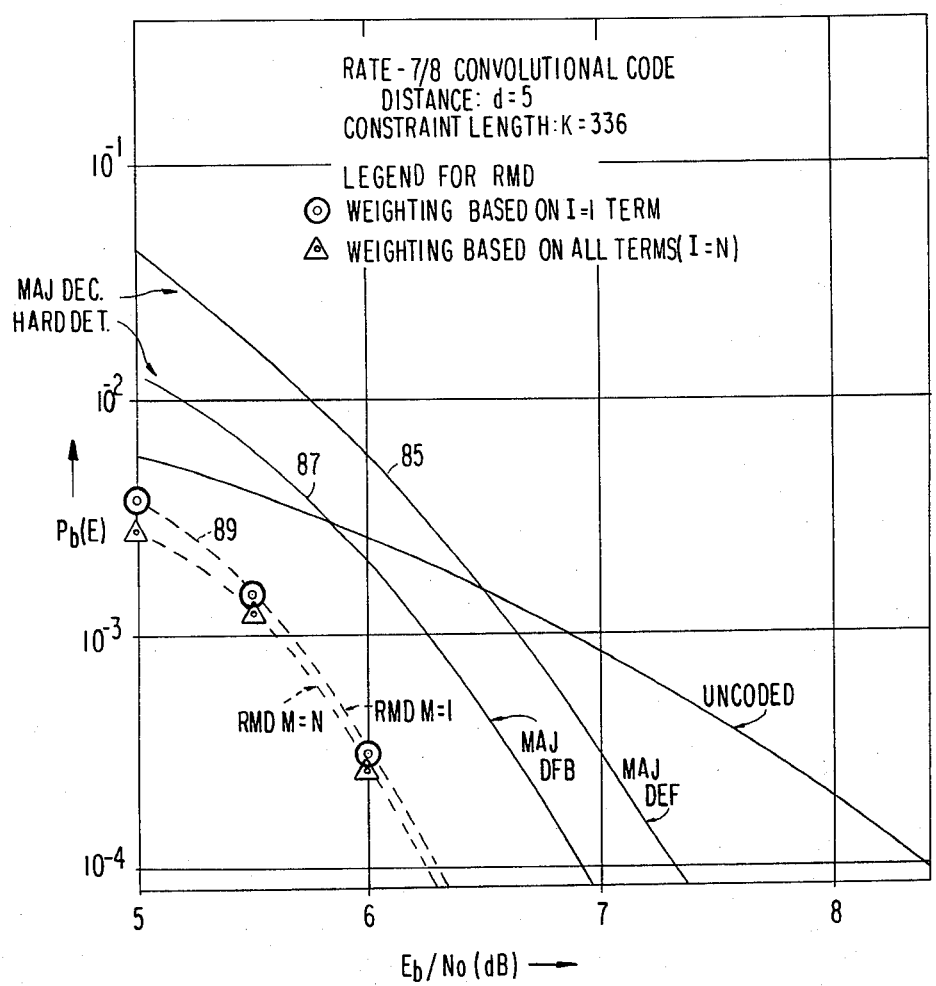
FIG. 8 is a graph of the performance of reliability majority decoding on a $\frac{7}{8}$ rate code with 8-level soft-detection.

As seen from the preceding Table V, the decoder results were not extremely sensitive to the quantization scale. It was decided to employ only a scaling of $V_Q=0.5$ for further tests. These simulaton runs were made sufficiently long to yield accurate estimates of decoder performance versus $E_b/N_o$. The decoder performance was also quite insensitive to the number I of least-reliable terms upon which the weighting of estimates is based when $I \geq 2$. There was some loss in performance when only one term, $I=1$, was used for the weighting. FIG. 8 illustrates the decoder results of $P_b(e)$ versus $E_b/N_o$ for $I=1$ (curve 89) and $I=28$ (curve 91). The latter case is for weighting based upon all terms in an estimate. Of course, the estimate obtained from the received information symbol has only a single term, so $I=28$ actually only refers to the $J=4$ bit estimates obtained from parity checks.

For RMD decoding with reliability weighting determined from all terms in an estimate, the decoding performance was improved with 8-level soft detection by about 1.0 dB relative to definite decoding (case of no feedback, curve 85) on hard decisions. Feedback (curve 87) provided an improvement of about 0.4 dB in decoding performance when hard detection was employed. It is expected that feedback would provide a comparable improvement in performance for RMD decoding with 8-level soft detection. Feedback could be implemented in the soft-detected case by updating of all terms in each estimate that have been previously decoded. The reliability weights for the terms that are fed back should also be reset to the highest level, which is 7 for 8-level soft detection.

It has been shown previously how the reliability level of the worst one of m terms can be determined with a simple implementation of logic and soft detection. Now a simple RMD weighting scheme will be described that is based upon multiple terms. By using all m terms in an estimate to obtain the reliability weighting, the requirement of determining the least-reliable level is avoided. Further, since addition is simpler than multiplication, reliability weighting based upon the product of individual weighting factors can more easily be accomplished by the addition of logarithms. The weighting process is an attempt to roughly classify an estimate into one of several categories. Hence, precise calculations of products is not a requirement. Therefore, the logarithms of individual terms may be represented by digital approximations. Consider weights of 1, 3, 5, and 7, which are used for 8-level soft detection. The corresponding logarithms to base 10 are 0, 0.478, 0.7, and 0.845. Division by 0.12 would yield numbers of approximately 0, 4, 6, and 7. These approximate logarithms can thus be used for mapping of the 4 reliability levels for soft detection. The basis for logarithmic addition is given by the following considerations.

If $\quad W = \sum_{i=1}^{n} W_i$

Then $\quad \log W = \sum_{i=1}^{n} \log W_i$

After the logarithms are summed for all terms in an estimate, then an antilog mapping may be used to obtain the final weight W from log W. Again, only an approximate mapping is required. According to further embodiment of the present invention, calculation of an appropriate reliability measure is significantly simplified by replacing the logarithmic computations with addition of demerits that are the 7's complements of the logarithms. The following mapping can be employed for the demerit assignment on 8-level soft-detected code symbols.

TABLE VI

Demerit Assignments for Logarithmic Determination of Reliability Weighting In RMD Decoding

| Reliability Weight | Logarithmic Assignment | Demerit Assignment |
|---|---|---|
| 7 | 7 | 0 |
| 5 | 6 | 1 |
| 3 | 4 | 3 |
| 1 | 0 | 7 |

Let D denote the sum of individual demerits $D_i$ for the m terms in an estimate.

$$D = \sum_{i=1}^{m} D_i$$

Now D must have an inverse mapping back into a reliability number W for the estimate of an information bit obtained from the n terms. Thus a mapping function F must be defined so that:

$W = F(D)$

When a large number of individual terms are involved in the weighting scheme, the product of individual weights tends to yield a reliability number that is somewhat smaller than the proper reliability would be if based upon the actual probability of error for the estimate. Two compensations for this problem are included in the weighting procedure according to the present invention. The first compensation occurs naturally when the optimum scaling is used for the quantization for soft detection. When the weighting is based upon all m terms in an estimate, the optimum scale turns out to be $V_Q=0.5$. Therefore, any terms with received voltages (including noise) at least one-half of the nominal voltage level will be assigned the highest reliability level and only those terms which fall below the $V_Q$ level of 0.5 will affect the reliability calculation. The second compensation is effected with the weighting function F(D), which has a saturation value of 7 demerits. Therefore, no matter how many terms fall below the maximum reliability level of 7, thereby introducing demerits, the estimator weight W can never be assigned a value less than 1. The mapping function of total demerits per estimate is listed below for 8-level quantization (4 reliability levels).

TABLE VII

| Inverse Mapping of Demerits Into Reliability Weights For RMD Decoding | |
|---|---|
| Total Demerits For Estimate D | Reliability Mapping W = F(D) |
| 0 | 7 |
| 1, 2 | 5 |
| 3, 4, 5, 6 | 3 |
| 7 or more | 1 |

Figure 9:
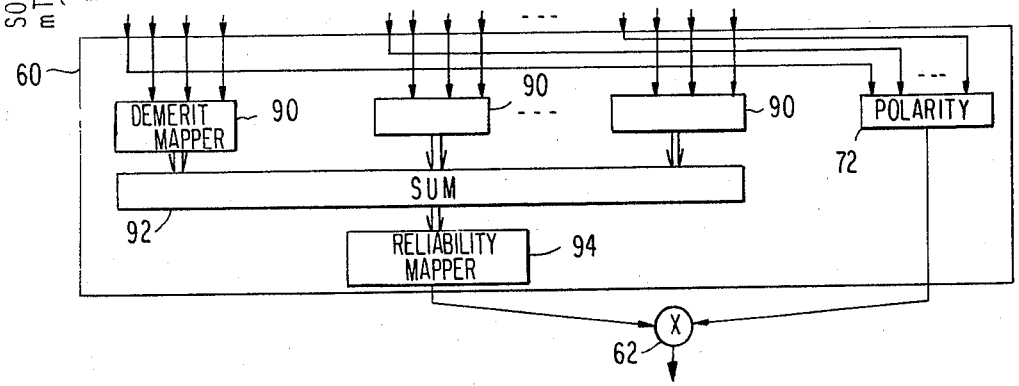
FIG. 9 is a schematic of an estimate and weighting factor generation circuit used to implement the demerit system of weighting according to a further embodiment of the present invention.

FIG. 9 briefly illustrates how the demerit system could be implemented. Demerit mappers 90, e.g., decoders, could receive the reliability vectors for respective symbols and provide outputs representing the corresponding number of demerits. The outputs of mappers 90 could be summed in adder 92 to obtain the total number of demerits for the estimate, and a further reliability mapper 94 could then provide the appropriate reliability weight.

A special case of RMD, termed Weighted Information Reliability (WIR) decoding, will now be described. With a high-rate code, the large number of terms in each of the J parity equations usually results in an estimate that is obtained from a parity being assigned the lowest reliability classification, a weighting of W=1. Therefore, most of the time the soft detection is wasted in classifying an estimate based upon a parity check. It follows that perhaps most of the gain in RMD decoding performance for a high-rate code that is obtained from soft detection could be obtained with the J estimates always assigned a fixed reliability weighting of 1. Then, soft detection would be used only for the purpose of classifying the estimate obtained from the received information symbol into one of four possible values of 1, 3, 5, and 7. This weighting scheme is very simple to implement for weighted majority decoding and is quite effective for high-rate codes.

In the implementation of the WIR weighting procedure based upon the information symbol alone, the variable weighting of this symbol determines how many parities are required to overrule the bit estimate obtained from this symbol. For 8-level soft detection, the information symbol is classified into one of 4 reliability levels: 1, 3, 5, and 7. For a weighting classification of $W_o$ assigned to the information symbol, the estimate of the information bit obtained from this symbol is assumed to be equivalent to that provided by $W_o$ parity equations. Therefore, there will in general be an equivalent number of $W_o+J$ estimates on each information bit for WIR decoding. The polarity of the received information symbol would be the same as the output by the decoder for that information bit unless more than 0.5 ($W_o+J$) parity checks on this information bit had "1" values. If this threshold of 0.5 ($W_o+J$) were exceeded, then the output bit value would be the modulo-2 complement of the value given by the received information symbol. Consequently, soft detection on the information symbol would result in an adaptive threshold on the number of parity checks required to reverse the detection decision on the bit polarity. For 8-level soft detection, the threshold for parity checks is listed in the following table for different numbers J of total parity checks.

TABLE VIII

| Variable Threshold Assignment for WIR Decoding With 8-Level Soft Detection | | | | | | | |
|---|---|---|---|---|---|---|---|
| Reliability of Information Symbol $W_o$ | Threshold T for Parity Checks | | | | | | |
| | J=2 | J=3 | J=4 | J=5 | J=6 | J=7 | J=8 |
| 7 | * | * | * | * | * | * | 8 |
| 5 | * | * | * | * | 6 | 7 | 7 |
| 3 | * | * | 4 | 5 | 5 | 6 | 6 |
| 1 | 2 | 3 | 3 | 4 | 4 | 5 | 5 |

*Information Symbol cannot be over-ruled.

As seen from the preceding table, when J=4 the received information symbol cannot be over-ruled by parity checks if the reliability assignment is either $W_o=5$ or $W_o=7$ for the information symbol. Therefore, these two reliability levels are indistinguishable. In effect, only 3 reliability levels or 6-level soft detection is obtained from the decoder viewpoint. With J=6, all 4 reliability levels could be utilized by the decoder. Therefore, the use of WIR decoding would perhaps be more effective for variable reliability weighting of the information symbol on codes with J=6 or more total number of parity checks on each information bit. However, the WIR results were very good on the code tested, even though it had only J=4 parity checks.

The probability of error can be determined for definite decoding (case of no feedback) with soft detection used only to weight the reliability of the received information symbol. The J estimates obtained from parity checks were given constant weightings for the lowest reliability class. Let $n_p$ denote the number of parity checks on the information bit that were broken (had "1" values), where J is the total number of parity checks and $T_r$ is the variable threshold. The received information symbol has some probability $P_r$ of being categorized by soft detection into the rth of R total reliability classes. Corresponding to the rth reliability category is an information symbol weighting of $W_r$ and the adaptive parity threshold of $T_r$. Now denote by $p_r=1-q_r$ the conditional probability of detection error on the information symbol when it is in the rth reliability class. Note that both $p_r$ and $Q_r$ are functions of the SNR per received code symbol and the quantization range factor $V_Q$. A decoding error can occur from a correct detection decision that is over-ruled by parity checks or by failure of the parity checks to over-rule an incorrect detection decision on the information symbol. With $n_p$ used to denote the number of parity checks with "1" values, the probability of error for definite WIR decoding is:

$$P_{DD}(e) = \sum_{r=1}^{R} P_r\{q_r P[n_p \geq T_r | q_r] + p_r P[n_p < T_r | P_r]\}$$

In the computation of probability of decoding error, binary-antipodal signalling is again assumed over a channel that is ideal except for additive white Gaussian noise of zero mean and variance $\sigma^2$. The probability p of detection error per binary decision corresponds to that for binary or quaternary forms of phase shift keying (BPSK or QPSK).

Let $\alpha_r$ denote the joint probability that the received level of signal plus noise has the correct polarity and is in the rth reliability category. Also, denote by $\beta_r$ the joint probability that the received voltage level has the incorrect polarity and is in the rth reliability category. Thus, $\alpha_r+\beta_r$ represents the probability $P_r$ that the signal level will be categorized in the rth reliability class.

$$P_r = \alpha_r + \beta_r$$

Without loss of generality in the analysis, it may be assumed that a positive voltage is transmitted. Then, for a detection signal level $v_o$ and a noise variance $\sigma^2$, the probability density function for signal plus Gaussian noise is:

$$f_V(v) = \frac{1}{\sqrt{2\pi}\,\sigma} e^{-\frac{(v-v_o)^2}{2\sigma^2}} \text{ where}$$

$$\frac{V_o^2}{\sigma^2} = 2\rho E_b/N_o$$

Denote by $U_r$ and $L_r$ the upper and lower limits, respectively, for the positive voltage levels in the rth reliability category. Then, $$\beta_r = \int_{+L_r}^{+U_r} f_V(v)\,dv$$

$$\alpha_r = \int_{-U_r}^{-L_r} f_V(v)\,dv$$

Given that the detected level of signal plus noise falls within the rth reliability category, the conditional probabilities of correct and incorrect polarity decisions are:

$$q_r = 1 - p_r = \frac{\alpha_r}{\alpha_r + \beta_r} = \frac{\alpha_r}{P_r}$$

$$p_r = 1 - q_r = \frac{\beta_r}{\alpha_r + \beta_r} = \frac{\beta_r}{P_r}$$

$V_Q$ represents a scaling parameter for the quantization. The highest quantization level is set at $V_Q$ times the nominal voltage level of $v_o$. For quantization into 2R levels, corresponding to R reliability categories, the quantization resolution or step size is:

$$\Delta = V_Q \frac{v_o}{R-1}$$

Hence, for R=4 reliability levels or 8-level quantization, the voltage thresholds used for the integration limits $U_r$ and $L_r$ are:

$$U_1,\ U_2,\ U_3,\ U_4 = \Delta,\ 2\Delta,\ 3\Delta,\ \infty$$

$$L_1,\ L_2,\ L_3,\ L_4 = 0,\ \Delta,\ 2\Delta,\ 3\Delta$$

P=1−Q is used to designate the probability of an odd number of detection errors on the m terms other than the information bit included in a parity check on this bit. Then Q denotes the probability of an even number of detection errors in the n terms. Note that the parity check also includes the information bit. In the absence of any detection errors, the parity check has a "0" value. If the information bit is detected correctly, the parity check will have a "1" value only if an odd number of other terms are in error. Also, when a detection error is made on an information bit, the value of the parity check will be "1" only if an even number of detection errors are made on the m terms. Therefore, $$P[n_p \geq T_r | q_r] = \sum_{j=T_r}^{J} \binom{J}{j} P^j Q^{J-j}$$

$$P[n_p < T_r | p_r] = \sum_{j=0}^{T_r-1} \binom{J}{j} Q^j P^{J-j}$$

where, for a probability p of detection error on each of the m terms, $$P = 1 - Q = \tfrac{1}{2} - \tfrac{1}{2}(1-2p)^m$$

$$Q = 1 - P = \tfrac{1}{2} + \tfrac{1}{2}(1-2p)^m$$

Figure 10:
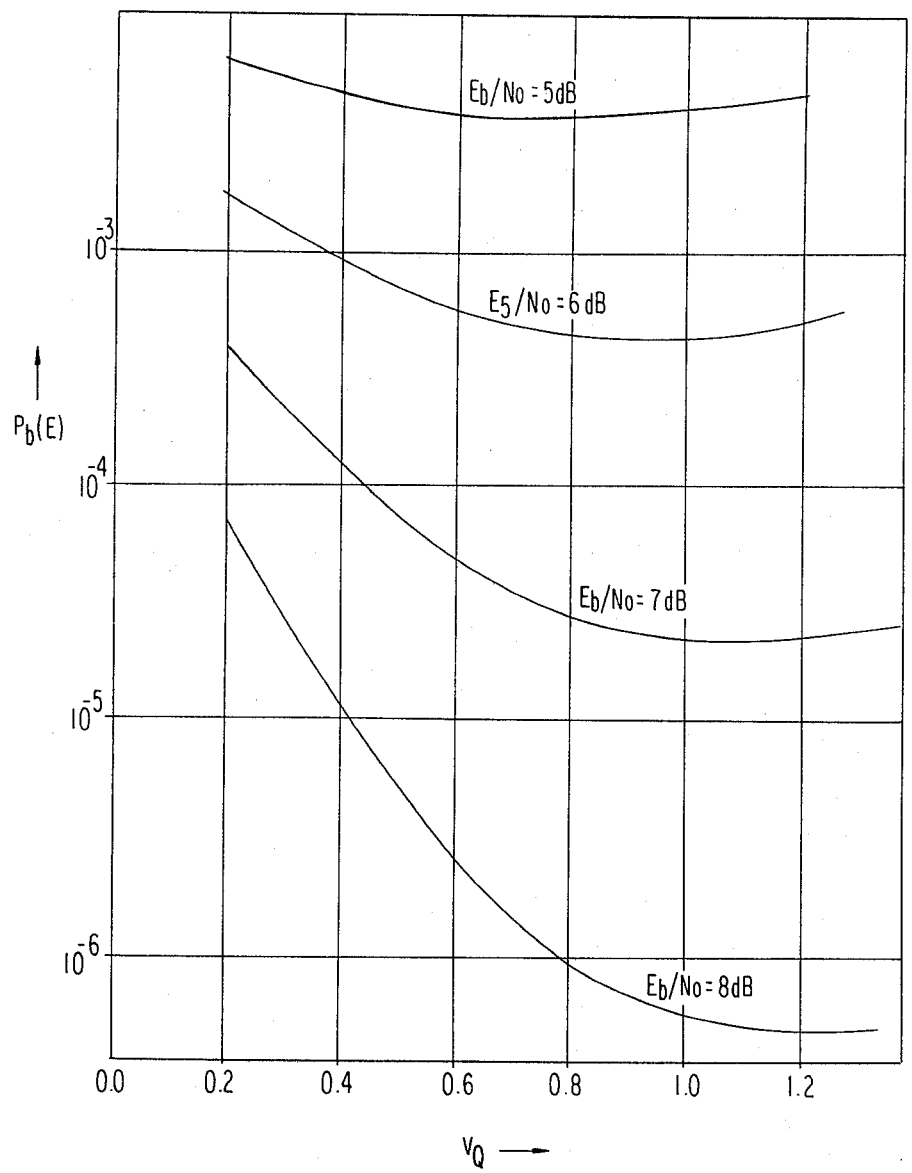
FIG. 10 is a graph of quantizer sensitivity curves for definite weighted information reliability decoding.

FIG. 10 contains curves for the theoretical probability of decoding error versus quantization scaling factor $V_Q$ that are parametric on $E_b/N_o$. Although the results are not very sensitive to $V_Q$ variations about the optimum value, the optimum $V_Q$ increases monotonically with $E_b/N_o$. At an $E_b/N_o$ of 5 dB, the optimum $V_Q$ is 0.7. The optimum $V_Q$ reaches 1.2 when $E_b/N_o$ is increased to 8 dB. However, the insensitivity of the decoder error rate to $V_Q$ is such that a fixed $V_Q$ of 1.0 over the $E_b/N_o$ range of 5.0 to 8.0 dB would result in only a negligible performance loss relative to that obtained with optimum $V_Q$ values.

Figure 11:
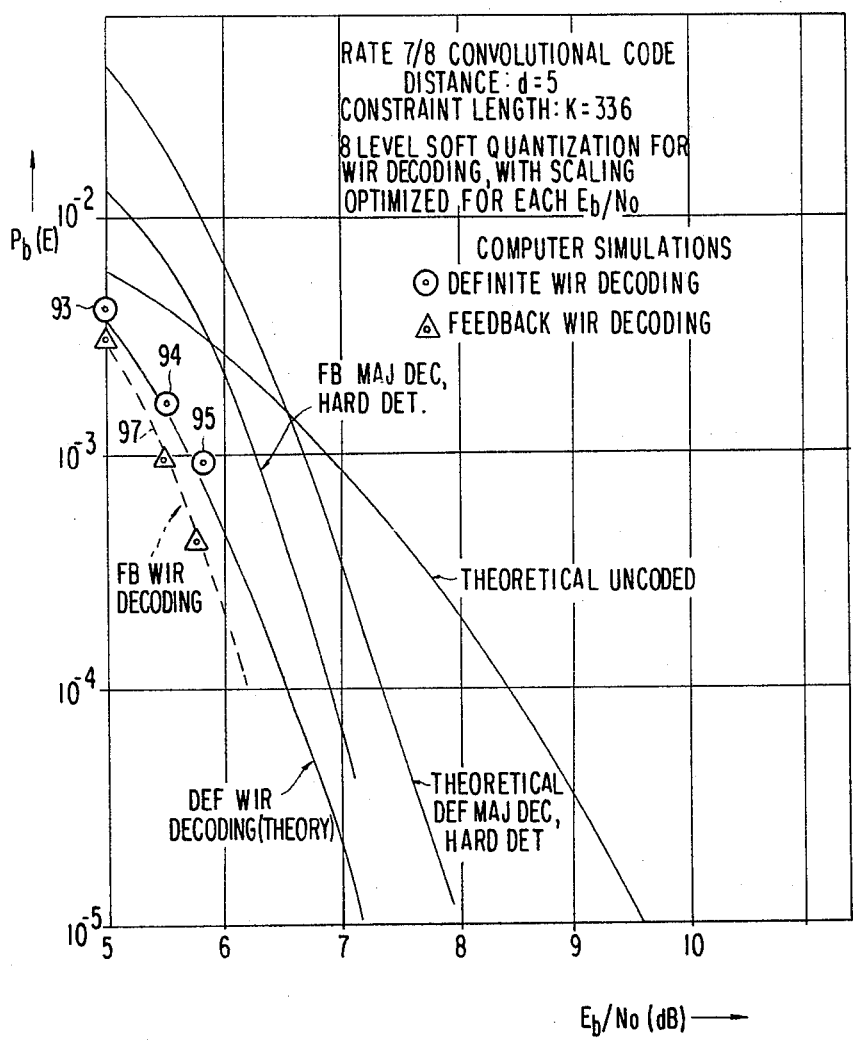
FIG. 11 is a graph of weighted information reliability decoding performance with optimum quantizer scaling.

Computer simulations were made to determine the performance of WIR on the ⅞-rate code when feedback is employed. Note the close agreement in FIG. 11 of the simulation results (points 93, 94, 95) with the theoretical decoder performance (curve 96) for the case of definite decoding. Near-optimum quantization for soft-detection was used in the computer simulations. The use of feedback (curve 97) is seen to yield an improvement of about 0.3 dB over definite decoding in the region of $10^{-4}$ decoder error rate. In general, the use of soft detection in WIR to weight the information symbol provides an improvement of at least 0.7 dB over conventional majority-logic decoding of hard-detected code symbols. In the feedback case, WIR provides a coding gain of about 2.2 dB at a probability of decoder error of $10^{-4}$. This result is approximately the same as that achieved by the full reliability weighting of RMD without feedback. Because of the simplicity of WIR decoding, the improvement of 0.7 dB in decoder performance afforded by soft detection is quite advantageous.

An alternative explanation of the decoding improvement afforded by soft detection for WIR weighting can be made. The dominating cause of errors for majority decoding on hard-detected code symbols is the overruling of correct detection decisions on the information bit by a majority of errors in the J orthogonal parity checks on this bit. Parity checks can thus be destructive when the detection estimate of the information bit is reliable. However, the parity checks are necessary for error correction when the detection decision is unreliable. Soft-detection of the information symbol allows the reliability of the detection estimate to be classified. Then, WIR decoding utilizes the reliability classification to effect an adaptive threshold so that parity checks are used in a manner that is always statistically constructive.

A further decoding improvement according to the present invention will now be described. Feedback of previous decoder decisions for syndrome resetting has been seen to yield a significant increase in decoder performance, such as 0.3 dB or more for some cases. Basically, the idea of feedback is to improve the reliability of the syndrome set of parity checks. In the J parity checks on each information bit in a decoder of the type shown in FIG. 4, about one-half of the total number of terms have been updated by decoder decisions. The other half of the terms have not been decoded as yet. If these terms could be improved, then the decoder performance could be enhanced even further than with simple feedback. By the use of additional decoding complexity and delay it is possible for all of the terms to be updated by an initial decoding which is used only for the purpose of improving the estimates. After the syndrome is updated, a second decoding step can then be provided to yield the final decisions. With sufficient delay between the two decoding operations, all of the terms that affect a decision by the second decoder will have been improved by the first decoding. This use of multiple decoders will be referred to as Cascaded Feedback Decoding (CFD) with the special case of two decoders being referred to as double decoding.

Essentially, the double decoding consists of two identical decoders in tandem. The second decoder utilizes the delayed parity check syndrome of the first decoder and, rather than the decoded output of the first decoder, uses a delayed sequence of the originally detected information symbols. Feedback can be employed for the parity check syndrome resetting in the first decoding to effect the increased reliability of the parity checks. Alternatively, if definite decoding (not feedback) is implemented for the first decoder, then the second decoder must use the output information symbols from the first decoder in forming the parity checks to be used in the second decoding operation. Note that the syndrome symbols that are parity checks on a given bit are relative estimates on this bit. The syndrome symbols obtained from the output of the first decoder are parity checks that signify agreement or disagreement with the information symbol value obtained from the first decoding. It is therefore necessary to subtract the value of the information symbol that is output from the first decoder to syndrome symbols that check this information symbol in order to obtain $J = d - 1$ independent estimates of the information symbol for the second decoding. The other estimate is the original detected value of the information bit.

A simple implementation of double decoding will now be explained with reference to FIGS. 12-15. In double decoding, the first of the two decoders will be one of the types previously described that performs weighted majority decoding with or without DFB for syndrome resetting, such as those shown in FIGS. 2 and 3. The information may be either hard-detected or may be soft-detected with a corresponding reliability weight assigned to it for RMD or WIR decoding. The second decoder will utilize both the original detected bits that were received as inputs by the first decoder as well as certain additional outputs from the first decoder. These additional outputs may include both the syndrome and the decoded bit values. Any reliability weighting given to the detected information bits by the first decoder could be sent to the second decoder, or the second decoder could compute these numbers from the soft-detection values themselves.

Figure 2:
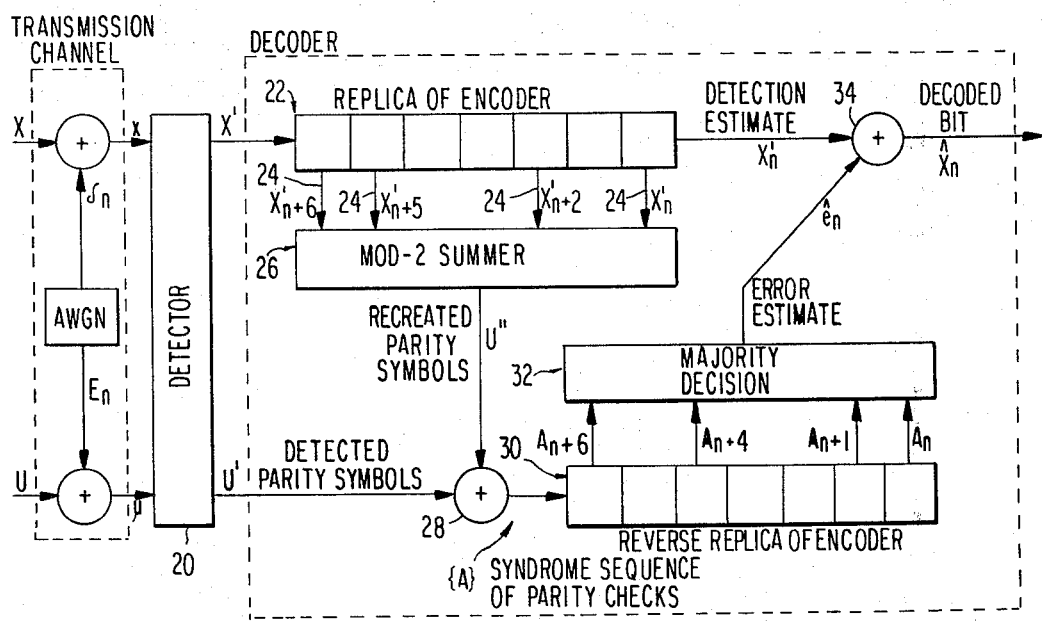
FIG. 2 is a brief block diagram of a conventional majority logic decoder.
Figure 3:
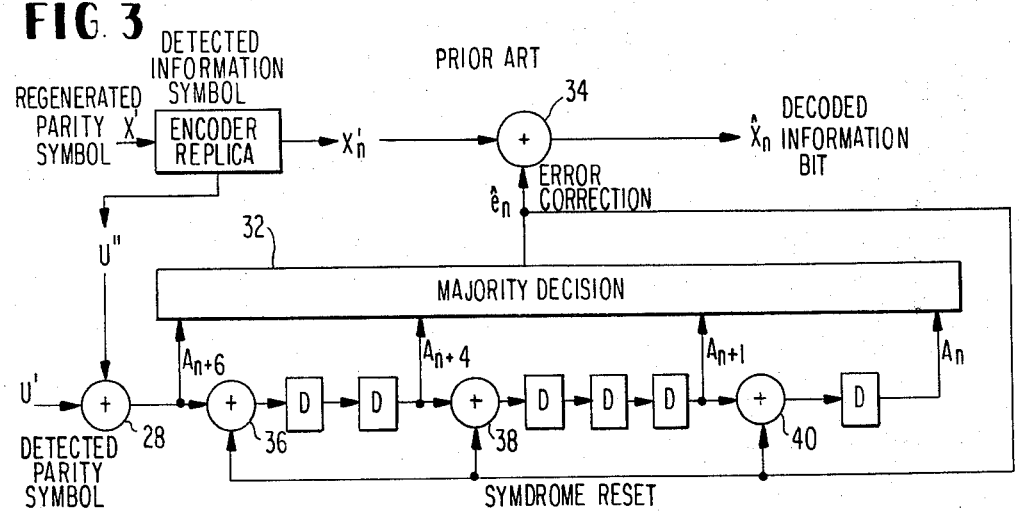
FIG. 3 is a block diagram of a feedback scheme used to correct parity checks in a conventional majority logic decoder.

There are essentially two cases which should be described separately for double decoding. The first case is that in which the first decoder utilizes syndrome resetting such as shown in FIG. 3. In the second case, the first decoder performs definite decoding as shown in FIG. 2 and therefore does not utilize syndrome resetting.

Figure 12:
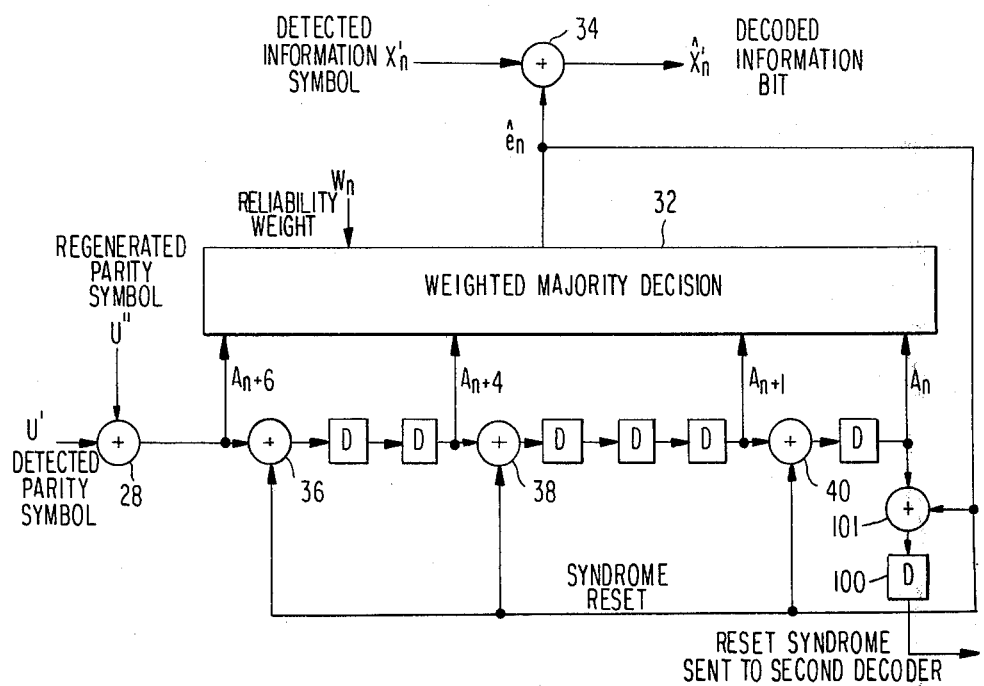
FIG. 12 is a block diagram of one example of the first decoder in a double decoding operating.

In the first case, syndrome resetting may be employed in substantially the same manner as illustrated in FIG. 3. In conventional majority logic decoding as shown in FIG. 3, syndrome resetting is not performed on the final parity check $A_n$ for a particular bit value $X_n$, since $A_n$ is not used at any later time in decoding information bits. In double decoding, however, the second decoder will make use of the updated syndrome, including $A_n$, and the feedback must be slightly modified so that $A_n$ may also be reset if necessary. Thus, the first decoder is realized by slightly modifying the circuitry of FIG. 3 by adding an additional delay 100 and modulo-2 adder 101 as shown in FIG. 12.

Figure 13:
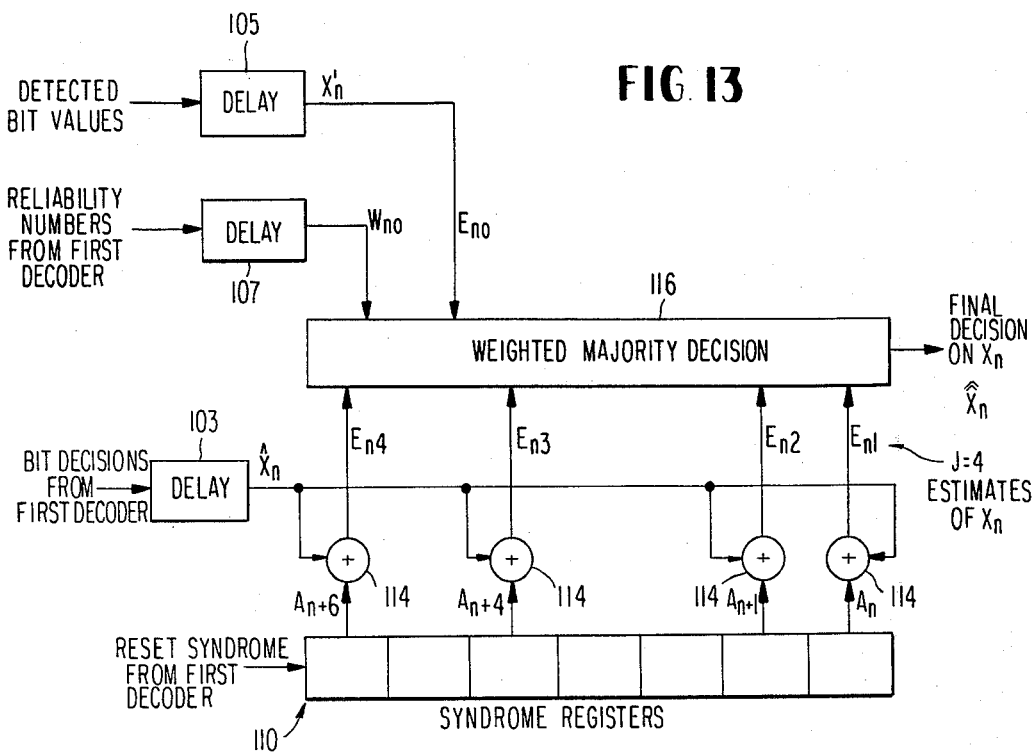
FIG. 13 is a block diagram of one example of a second decoder in a double decoding operation wherein the first decoder employs syndrome resetting.

The second decoder would be as shown in FIG. 13. As inputs, the second decoder would receive the decoded information bit $X_n$ from the output of modulo-2 adder 34 in FIG. 12 through delay 103, and the reset syndrome values from the output of delay 101 in FIG. 12 and the detected bit values $X'_n$ from the input of adder 34 in FIG. 12 through delay 105. If conventional definite decoding is performed, all values in the second decoder will be assigned equal fixed reliabilities, e.g. unity. On the other hand, if WIR decoding is to be used, it will be necessary to obtain a reliability measure for the detected bit value $X'_n$. This reliability measure can either be forwarded through delay 107 from the first decoder or the reliability measure could be generated from the soft-detected bit value $X'_n$ which is forwarded from the first decoder.

Since the updated syndrome is already available from the first decoder, there is no need for the second decoder to contain a replica of the encoder which would otherwise be necessary to generate each parity check in the syndrome.

It should be noted that the reset syndrome received at the second encoder and provided to the syndrome register 110 is composed of parity checks that correspond to the decoded information bits provided to the delay 103 from the first decoder. Since the decoded information bit itself constitutes one term in each of the parity checks, the addition of the decoded bit to each of the corresponding parity checks will result in a plurality of estimates of $X_n$. Thus, adding the decoded bit values $\hat{X}_n$ to the parity checks from the syndrome register in modulo-2 adders 114 will convert the $J = d - 1$ orthogonal parity checks on $X_n$ obtained from the syndrome register of the first decoder into J independent estimates of $X_n$ for the second decoder. Note that these $J = d - 1$ estimates in the second decoder are based upon modulo-2 sums that contained terms having improved reliability due to the first decoding. It is this improvement in the reliability of the J estimates that is responsible for the improvement in reliability of the bit decisions achieved by the double decoding technique.

The multiple estimates at the outputs of adders 114 are supplied to the majority decision circuit 116 together with the detected bit value $X'_n$. If soft detection is not employed (, i.e. conventional hard decision definite decoding), both the first and second decoders will perform majority decisions in which all weights are fixed (unity in most cases). If soft detection is employed, all of the estimates from adders 114 should be given equal weighting, and the detected bit value $X'_n$ will be given some weight $W_n$ based upon its soft-detected value. It should also be appreciated that it would be possible to utilize hard decision decoding in the first decoder followed by soft decision in the second decoder.

In the second case of double decoding in which no syndrome resetting is performed in the first decoder, the second decoder must create the syndrome from the decoded symbols $\hat{X}_n$ received from the first decoder. Thus, the second decoder will utilize a replica of the encoder for recreating parity symbols. In the second decoder illustrated in FIG. 14, the encoder replica 118 includes a shift register 120 and modulo-2 adder 122 which are similar to the corresponding components shown in FIG. 2 except that they generate parity symbols not from the detected bit values $X'_n$ but from the decoded bit decisions of the first decoder. Thus, the regenerated parity symbols at the output of adder 122 are more reliable in the double decoding operation. These regenerated parity values are compared in modulo-2 adder 124 with the originally detected parity values to obtain a new syndrome. The values in the syndrome register are again added to the corresponding decoded value $\hat{X}_n$ in adders 114, and the resulting estimates of $X_n$ are supplied to the majority decision circuit 116.

As was the case in FIG. 13, the estimates from adders 114 are given equal fixed reliability weights and, if no soft detection is employed in the first decoder, the detected value $X'_n$ is also given a fixed weight and a conventional majority decision is performed. On the other hand if soft detection is employed, the reliability weights of the detected bit values can be forwarded from the first detector or, in the alternative, a reliability weight calculator 130 can be provided in the second decoder to generate the reliability measures from the soft detected values of the received bits.

Figure 15:
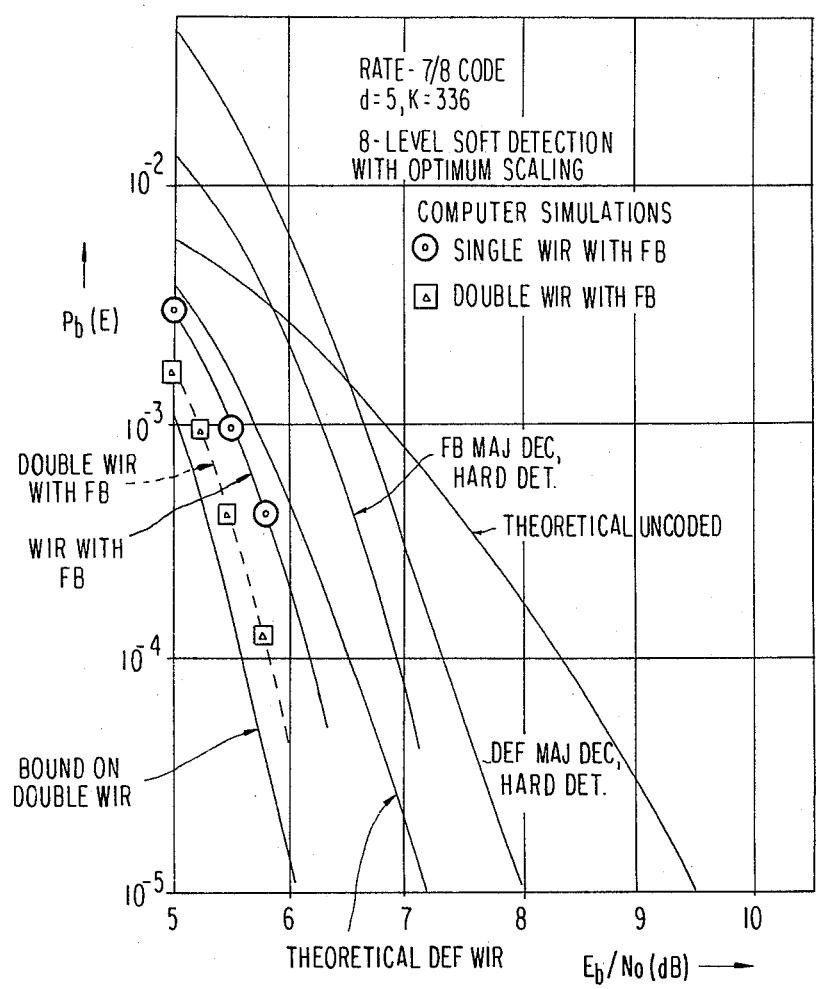
FIG. 15 is a graph of the performance of double WIR decoding of a $\frac{7}{8}$ rate code.

As illustrated in FIG. 15, the improved syndrome reliability of double WIR decoding is advantageous. Feedback was employed for both decoders in the simulation of double WIR decoding. An improvement of about 0.3 dB over single WIR decoding with feedback was obtained. Thus, the $E_b/N_o$ requirement for a decoder error rate of $P_b(e)=10^{-4}$ was reduced to about 5.9 dB or less, for a total coding gain of 2.5 dB for double WIR decoding with feedback. Although feedback was used for both decoders, the feedback was used for the first decoder only for syndrome resetting. The second decoder based its decision upon $d=J+1$ estimates on each bit. Of these d estimates, $J=4$ are obtained from the reset syndrome of the first decoder. However, the other estimate and its weighting are obtained from the soft-detected information symbol rather than from the first decoder output.

An alternative explanation for the performance improvement from double decoding is its effect upon the equivalent constraint length of the code. For a code with a constraint length of K information symbol intervals, each information symbol can appear in parity equations that include other information symbols that occur at a time difference up to K−1 bit intervals in the future and in the past. In double decoding, the first decoder provides the equivalent of both feedback and feedforward of decisions on the information symbols of each parity check. With feedback alone, the (K−1)th bit in the past has already been decoded with the aid of parity checks that included terms up to 2(K−1) bit intervals in the past. Similarly, feedforward terms in double decoding have been provided by the first decoding operation. With respect to the second decoding of an information symbol, the feedforward terms were previously decoded with the aid of information symbols that occurred up to 2(K−1) bit intervals in the future, where future is used in a relative sense only. Consequently, the use of double decoding effectively provides both feedback and feedforward of decoder decisions to improve the final decision on the present bit by equivalently doubling the constraint length of the code.

Double decoding was simulated only for the case of WIR decoders. In WIR decoding, each of J estimates have fixed weighting, with adaptive reliability weighting applied only to the information symbol. It should be appreciated, however, that double decoding could also be employed for conventional majority-logic decisions, in which all $d=J+1$ estimates are given fixed equal weightings of unity each.

The use of double decoding would also make it possible to obtain a simple implementation of full reliability weighting on each of the d estimates of each information bit in the second decoding. For the purposes of discussion, this new form of double decoding will be identified as WIP, weighted information and parity. For WIP decoding, the first decoding operation is performed with a WIR decoder that employs feedback for syndrome resetting only. Consequently, after the first decoding operation, all parity checks are based upon information symbols with improved reliability. However, the received parity symbols that are used in the parity checks do not have their reliabilities improved by the first decoding. It follows that each parity check of the reset syndrome cannot be any more reliable than the received parity symbol that is included in the modulo-2 check equation. Relative to this parity symbol, the other terms (all information symbols) in a parity check may be considered as almost noiseless after the first decoding operation. Consequently, a reliability weighting for the parity check can be assigned by observing the soft-detected level of the received parity symbol. Therefore, in the second decoder for WIP decoding, all d estimates on each information bit will have adaptive reliability weightings based upon soft-detection voltage levels.

For WIP decoding, 8-level soft-detection allows the information symbols to be classified into one of four reliability weightings: 1, 3, 5, or 7. With m terms in each parity check, the m−1 information symbols will cause some reduction in reliability if the other term, the parity symbol, is in a high reliability class. If the parity symbol is in a low reliability class, however, it alone will almost completely determine the reliability of the total parity check. Therefore, a reliability set of 1, 2, 3, and 4 is proposed for the parity check, corresponding to soft-detected reliability levels of 1, 3, 5, and 7, respectively, for the parity symbol included in the parity check. Thus, the J estimates of each information bit that are obtained from parity checks would have a variable weighting set of 1, 2, 3, and 4, but the single bit estimate obtained from the soft-detected information symbol would have a different weighting set of 1, 3, 5, 7.

Figure 14:
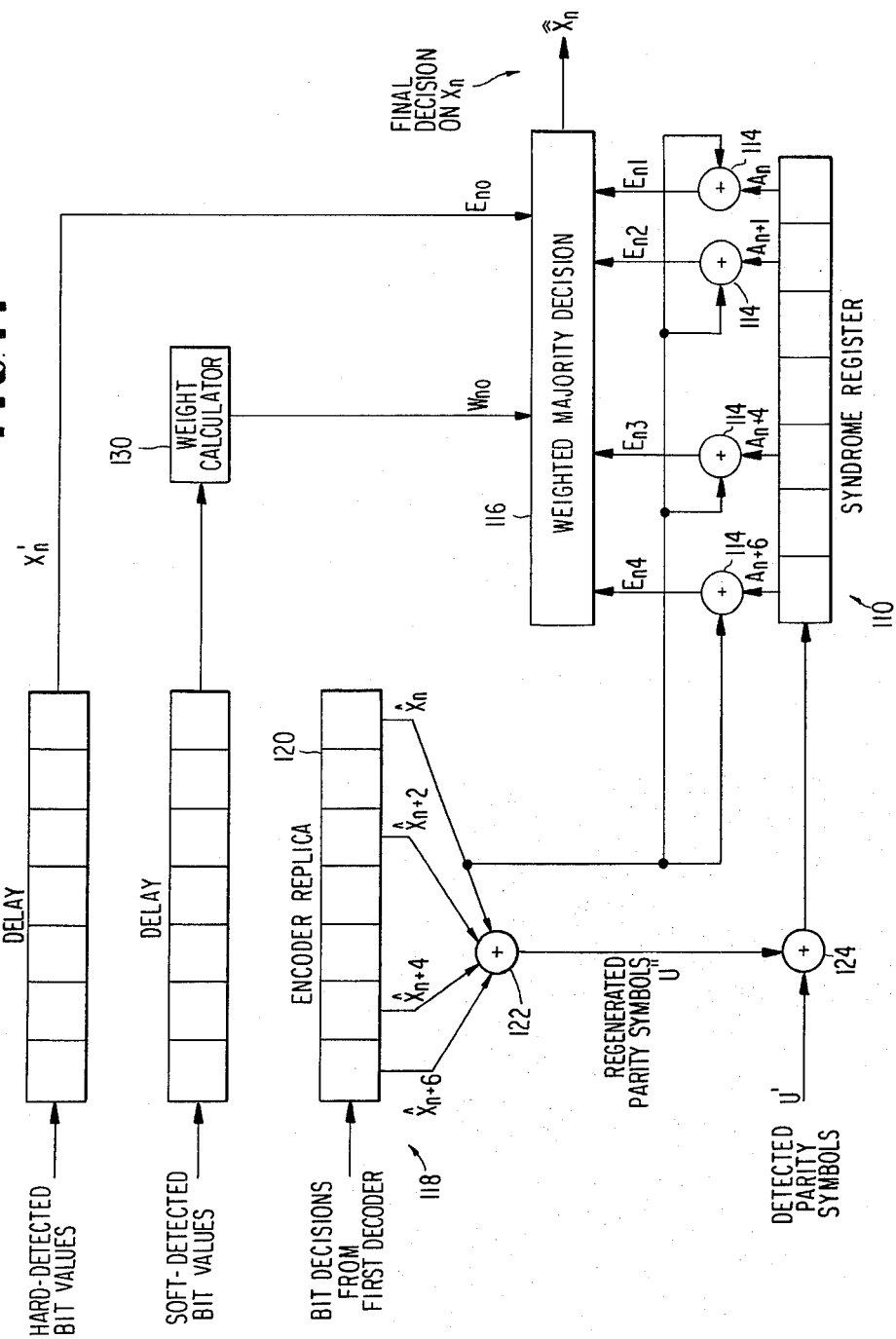
FIG. 14 is a block diagram of one example of a second decoder in a double decoding operation where syndrome resetting is not employed.
Figure 16:
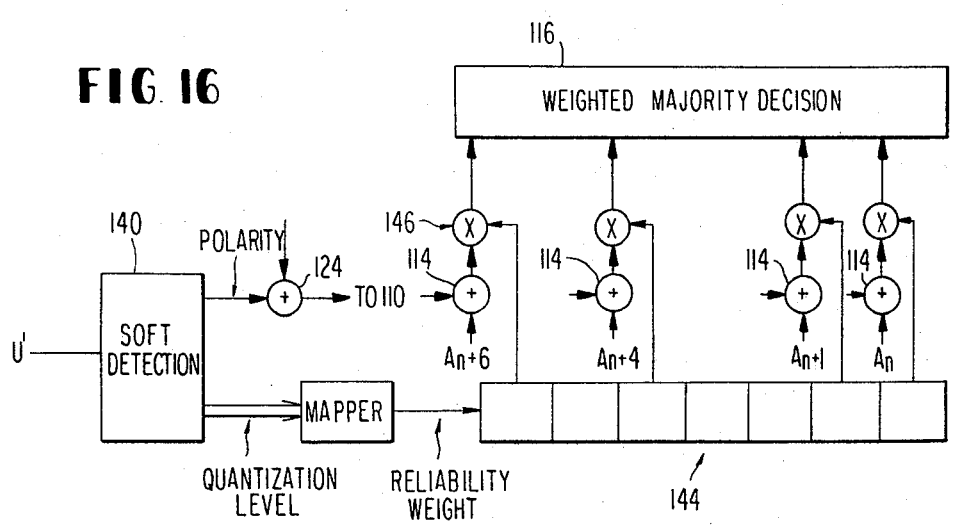
FIG. 16 is a brief block diagram of an encoder for implementing parity symbol error protection in an FEC code.

As shown in FIG. 16, the second decoder could employ soft detection of the received parity symbols with the polarity bit being provided from the detector 140 to the adder 124 in FIG. 14. The detected quantization level could be decoded in mapper 142, which would be similar to decoder 63 in FIG. 4b but may assign a different set of reliability weights to each quantization level. The output of mapper 142 would be provided to the input of a complex shift register 144. The estimate at the output of each adder 114 would be multiplied by the reliability weight of the parity symbol involved in that estimate, and the resulting weighted estimates supplied to weighted majority decision circuit 116. In all other respects, the decoder would be the same as that shown in FIG. 14.

A still further decoding improvement according to the present invention will now be described. In FEC coding, the final output of the decoder consists only of information bits and, therefore, most FEC codes do not provide any error protection for the parity symbols. In double decoding, however, the J estimates of each bit that are obtained from the syndrome of the parity checks in the second decoder include sums of some parity symbols as well as information bits. Whereas the reliabilities of the information bits used in calculating the parity checks have been improved in the first decoder, the reliabilities of the received parity symbols have not been improved. Better performance can be provided if the parity symbols are also given error protection.

The protection of parity symbols in FEC coding is a relatively straightforward matter. For example, in convolutional FEC codes of rate k/n, there are typically k shift registers in parallel used to produce n−k parity symbols during each encoding step of k information bit intervals. Each of these n−k parity streams can be fed to a shift register with appropriate tap connections for error protection. With this change, there could be n shift registers in parallel with taps selected so that all n bit streams would have equal protection. Consequently, the parity symbols would also be treated as information symbols in the first decoding operation of the double decoder.

Considering the parity symbols as "information bits" for the purposes of the first decoding would also permit double WIR decoding in which WIR weighting was employed in the first decoder for parity symbols as well as for information symbols.

Figure 17:
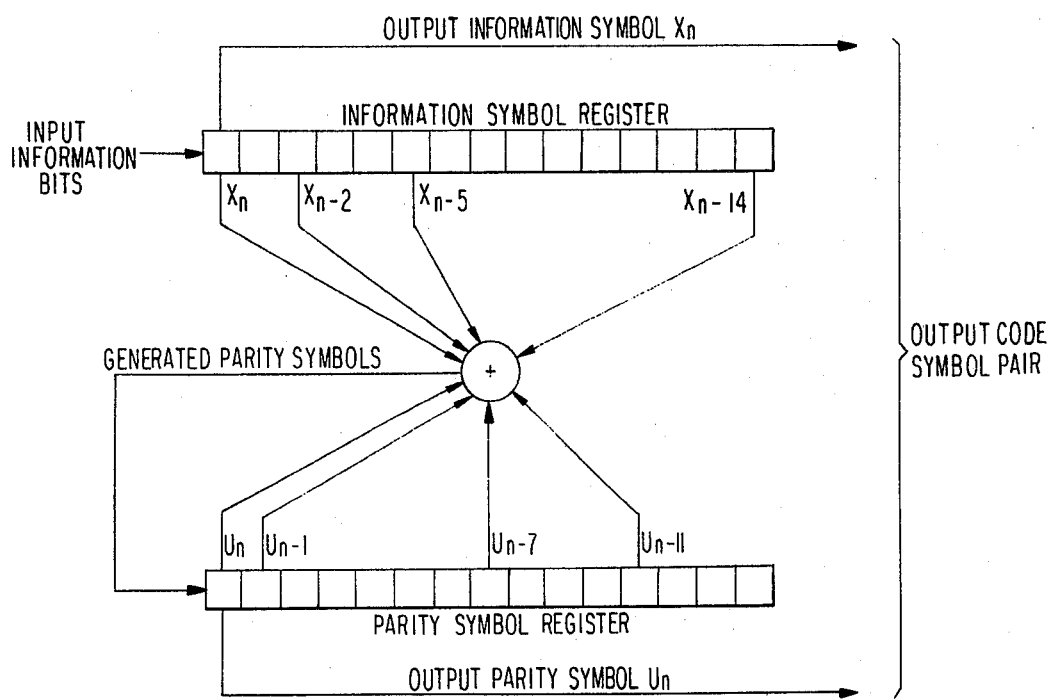
FIG. 17 is a brief block diagram of the essential components of a second decoder modified to implement weighted Information and Parity (WIP) decoding.

FIG. 17 illustrates a simple technique for improving the reliability of parity symbols in a convolutional FEC code of distance $d=5$. The code is of rate $\rho=\frac{1}{2}$ or $k=1$ and $n=2$. Two encodings in parallel are performed for the information symbols X and the parity symbols U. The encoder taps are selected to yield self-orthogonality of the parity checks on both X and U sequences. Thus, weighted majority decoding of both X and U can be employed on $d=J+1$ independent estimates of each symbol, with the detected symbol constituting one of the d estimates and the orthogonal parity checks on this symbol constituting the other J estimates.

For a generalized rate k/n code, the encoder would include k information symbol shift registers as is the case with the seven shift registers in the rate $\frac{7}{8}$ encoder of FIG. 7, and there would also be (n−k) parity symbol registers. There would be (n−k) modulo-2 adders each receiving tap connections from each of the k information symbol shift registers, and the outputs of the modulo-2 adders would each be supplied to separate one of (n−k) parity symbol shift registers. The parity symbol shift registers would provide tap connection inputs to their respective adders in a manner similar to that shown in FIG. 17, so that the output of the encoder would include n symbols comprising k information symbols from the inputs to each of the k information symbol shift registers and (n−k) parity symbols provided from the outputs of the (n−k) modulo-2 adders. Note that n shift registers in parallel are used for the encoding, k registers for the k information symbols and (n−k) registers for the (n−k) parity symbols.

In double decoding of code symbols generated according to this method, the first decoder would include an encoder replica with k information symbol shift registers and n−k modulo-2 adders providing parity symbol outputs. As in the encoder, each of the adder outputs is fed back to the input of a different one of (n−k) parity symbol shift registers. The n−k regenerated parity symbols output by the adders would be compared with the corresponding n−k received parity symbols to generate n−k syndromes indicating agreement or disagreement between the regenerated and received parity symbols. n different majority logic decisions would be performed on tap connections from the n−k syndromes which are mirror images of the tap connections in the encoder, and the received information and parity symbols would be updated or passed in accordance with the respective majority logic decisions. The n−k syndromes would preferably also be reset in accordance with the majority logic decisions on the parity symbols.

The reset syndromes, decoded bit values and detected bit values would then be supplied from the first decoder to the second decoder, which would then operate in a manner substantially similar to that illustrated in FIG. 14. k weighted majority decision circuits would be employed, one for each of the k information bits in the code. A first majority decision circuit would receive as one estimate the detected information symbol and optionally the soft detected bit values, and as its other estimates it would receive tap connections from the n−k syndrome registers. However, since these tap connections are relative estimates, they would have to be first converted to absolute estimates by complementing them with the first decoded bit value in an identical manner as in adders 114 in FIG. 14. The output of the weighted majority decision circuit would correspond to the first of the k information symbols in the code. The second decoder would include k registers of the type designated by reference numeral 120 in FIG. 14 and would receive in parallel the k detected bit values. Also, each of the regenerated parity symbols from (n−k) modulo-2 adders would be fed back to one of (n−k) parity symbol registers. Additional weighted majority decisions would be performed in a similar manner with the conversion to absolute estimates being performed by complementing the syndrome register tap connections with the first decoded value in each of the k encoder replica shift registers, so that the k weighted majority decision circuits would provide the k information symbols in the code. Note that weighted majority decisions are made only on information bits in the second decoding since there is no need to obtain new estimates of the parity symbols.

In the simple example of the rate $\frac{1}{2}$ encoder of FIG. 17, the first decoder would include an encoder replica similar to the encoder shown in FIG. 17 which would regenerate a parity symbol at the output of the modulo-2 adder. This would be compared with the received parity symbol to form a single syndrome, and mirror image tap connections from this syndrome would be used to perform majority logic decisions on the information and parity symbols. The received information and parity symbols would then be updated or passed in accordance with the majority logic decisions, and the syndrome would also be reset in accordance with these majority logic decisions. The second decoder could then receive the decoded parity symbols and information symbols as well as the received information symbols from the first decoder and would operate in a manner identical to that shown in FIG. 14. Alternatively, rather than supply the second decoder with the decoded parity symbols, the updated syndrome from the first decoder could be directly provided to the second decoder so that the encoder replica 118 and modulo-2 adder 124 would not be necessary.

There are two well-known types of majority logic decoders, type I decoders in which a plurality of parity checks are performed on each information bit and the detected bit is then changed or passed in accordance with a polling of the parity checks, and type II decoders in which a plurality of estimates of each bit are generated and a decoded bit is produced in accordance with a polling of these estimates. Since, as described above, the detected bit being decoded is one of the terms involved in each parity check on that detected bit, it can be seen that each parity bit in a type I decoder is an estimate of the decoded bit valve which is dependent on the detected bit valve. In other words, the estimates in a type II decoder may be referred to as absolute estimates whereas the parity checks in a type I decoder are relative estimates, i.e. estimates relative to the detected bit valve. While the present invention has been shown and described primarily with reference to type II decoding, it should be easily appreciated that any or all of the decoders could be type I. The term "estimates", as used in the following claims, refers to either the absolute estimates of a type II decoder or the relative estimates, i.e. parity checks, in a type I decoder.

I claim:

1. A method of weighted majority decoding of code symbol signals included in a forward error correcting (FEC) code, said code symbol signals including information symbol signals representing information symbols having at least first and second code values and parity symbol signals representing parity symbols generated from selected combinations of said information symbols, said method comprising the steps of:

receiving information symbol signals representing the code values of said information symbols, receiving parity symbol signals representing the values of said parity symbols;

soft detecting said information symbol signals to detect the voltage of each information symbol signal;

generating a code value signal indicating the code value represented by each said information symbol signal;

generating an information symbol reliability signal representing the reliability of each said code value signal;

detecting said parity symbol signals and generating a parity value signal corresponding to the detected value of each parity symbol;

generating a first estimate of the code value of a particular information symbol from the code value signal corresponding to that symbol;

assigning to said first estimate a symbol weighting factor in accordance with the information symbol reliability signal corresponding to the detected information symbol signal for said particular information symbol;

combining selected ones of said code and parity value signals to obtain at least one further estimate of the code value of said particular information symbol;

assigning to said at least one further estimate a fixed symbol weighting factor;

combining corresponding estimate weighting factors and code value estimates to obtain weighted estimates;

combining said weighted estimates to obtain a combined weighted estimate; and providing a decoded symbol in accordance with the value of said combined weighted estimate.

2. A method as defined in claim 1, wherein the step of generating an information symbol reliability signal for each code value signal comprises the step of generating a selected one of a plurality of predetermined reliability signals indicating one of a corresponding plurality of reliability classifications, and the fixed symbol weighting factor assigned to said at least one further estimate corresponds to the lowest level of said reliability classifications.

3. A method as defined in claim 1 or 2, wherein said at least one further estimate comprises a plurality of estimates each of which is assigned a fixed estimate weighting factor.

4. A method of weighted majority decoding of code symbol signals included in a forward error correcting (FEC) code, said code symbol signals including information symbol signals representing information symbols having at least first and second code values and parity symbol signals representing parity symbols generated from selected combinations of said information symbols, said method comprising the steps of:

receiving information symbol signals representing the code values of said information symbols;

receiving parity symbol signals representing the values of said parity symbols;

soft detecting said information symbol signals to detect the voltage of each information symbol signal;

generating a code value signal indicating the code value represented by each said information symbol signal;

generating an information symbol reliability signal representing the reliability of each said code value signal;

soft detecting said parity symbol signals to detect the voltage of each parity symbol signal;

generating a parity value signal indicating the value represented by each said parity symbol signal;

generating a parity symbol reliability signal representing the reliability of each said parity value signal;

generating a first estimate of the code value of a particular information symbol from the code value signal corresponding to that symbol;

combining m selected ones of said code and parity value signals to obtain at least one further estimate of the code value of said particular information symbol;

assigning to said first estimate an estimate weighting factor in accordance with the information symbol reliability signal corresponding to the self-detected information symbol signal for said particular information symbol;

determining for said at least one further estimate an estimate weighting factor derived from the reliability signals of the l least reliable code and parity value signals which were combined to obtain said at least one further estimate, where l is an integer greater than 1 and less than m;

combining corresponding estimate weighting factors and code value estimates to obtain weighted estimates;

combining said weighted estimates to obtain a combined weighted estimate; and providing a decoded symbol in accordance with the value of said combined weighted estimate.

5. A method as defined in claim 4, wherein said at least one further estimate comprises a plurality of estimates.

6. A method as defined in claim 4, wherein said step of generating a parity symbol reliability signal comprises the step of generating one of a plurality of predetermined reliability signals corresponding to one of a corresponding plurality of predetermined reliability classifications, and wherein said step of generating an information symbol reliability signal comprises the step of generating a fixed reliability signal corresponding to the highest of said reliability classifications.

7. A method of weighted majority decoding of code symbol signals included in a forward error correcting (FEC) code, said code symbol signals including information symbol signals representing information symbols having at least first and second code values and parity symbol signals representing parity symbols generated from selected combinations of said information symbols, said method comprising the steps of:

receiving information symbol signals representing the code values of said information symbols;

receiving parity symbol signals representing the values of said parity symbols;

soft detecting said information symbol signals to detect the voltage of each information symbol signal;

generating a code value signal indicating the code value represented by each said information symbol signal;

assigning to each code value signal a number of demerits corresponding to the reliability of the code value represented by each said code value signal;

soft detecting said parity symbol signals to detect the voltage of each said parity symbol signal;

generating a parity value signal corresponding to the value of each parity symbol signal;

assigning to each parity symbol signal a number of demerits corresponding to the reliability of the parity value represented by said parity symbol signal;

combining selected ones of said code and parity value signals to obtain a plurality of estimates of the code value of a particular information symbol;

combining the demerits assigned to each of the code and parity value signals used to obtain each estimate in order to obtain a combined demerit value for each said estimate;

assigning to each said estimate an estimate weighting factor in accordance with said combined demerit value;

combining corresponding estimate weighting factors and code value estimates to obtain weighted estimates;

combining said weighted estimates to obtain a combined weighted estimate; and providing a decoded symbol in accordance with the value of said combined weighted estimate.

8. A method as defined in claim 7, wherein the number of demerits assigned to each symbol value varies inversely with the reliability of the value of that symbol.

9. A method as defined in claim 8, wherein said plurality of terms in said determining step comprises all of the terms involved in each said estimate.

10. A method as defined in claim 9, wherein the maximum value of said combined demerit value is equal to the maximum value of demerits which can be assigned to a symbol signal of lowest reliability.

11. A method of weighted majority decoding of a forward error correcting (FEC) code, said code comprising code symbol signals including information symbol signals representing information symbols having at least first and second code values and parity symbol signals representing parity symbols generated from selected combinations of said information symbols, said method comprising the steps of:

soft-detecting said information and parity symbol signals and generating for each of said soft-detected signals a multi-bit signal having one bit representing the value of the detected symbol signal and a plurality of remaining bits representing the reliability of said symbol value;

combining said one bits of selected ones of said multi-bit signals to obtain a plurality of estimates of the code value of a particular information symbol;

determining an estimate weighting factor for each said estimate in accordance with the least reliable code value used in obtaining said estimate, said determining step comprising the steps of combining corresponding ones of said remaining bits for each symbol in respective AND gates, the combined outputs of said AND gates being the equivalent of the remaining bits of the least reliable term involved in said estimate, and assigning to each said estimate a weighting factor corresponding to the combined outputs of said AND gates;

combining the estimate weighting factors and corresponding code value estimates to obtain a plurality of weighted estimates of said particular symbol;

combining said weighted estimates to obtain a combined weighted estimate; and providing a decoded symbol in accordance with the value of said combined weighted estimate.

12. A method as defined in claim 11, wherein said code is a binary code having only first and second code values and wherein said step of combining selected ones of said information and parity symbols comprises the step of logically summing in a mod-2 adder the said one bit in each of said multi-bit signals representing the code value of said symbol and assigning a polarity of either $+1$ or $-1$ in accordance with the output of said mod-2 adder, said step of combining the estimate weighting factors and corresponding code value estimates comprising the multiplication of said assigned polarity value by said assigned estimate weighting and said providing step comprising the step of threshold detecting said combined weighted estimate with a zero threshold level.

13. A method as defined in claims 1, 4 or 7, wherein said step of providing a decoded symbol comprises the step of threshold detecting said combined weighted estimate with a threshold substantially equal to the midpoint between said first and second code values.

14. A method of generating a forward error correcting (FEC) majority logic decodable code from a series of information bits, said code comprising a series of output code symbol signal sets, said code being a rate $p = k/n$ code wherein each output code symbol set includes k information symbols and $(n-k)$ parity symbols where n and k are positive integers and n>k, said method comprising the steps of:
  providing said k information symbols to k respective information symbol shift registers;
  coupling selected stages of each of said k information symbol shift registers as a first set of inputs to each of (n−k) modulo-2 adders, each of which modulo-2 adders combine its respective first set of inputs with a second set of inputs and provides a parity symbol output; and
  providing the parity symbol output from each adder as an input to a corresponding one of (n−k) parity symbol shift registers, selected stages of said parity symbol shift registers being provided as said second set of inputs to corresponding modulo-2 adders, the inputs to said information and parity symbol shift registers constituting an output code symbol set.

15. A method of decoding a majority logic decodable code encoded according to the method of claim 14, said code being a rate $p=k/n$ code including output code symbol sets each including k information symbols and (n−k) parity symbols, where n and k are positive integers and n>k, said decoding method comprising the steps of:
  receiving said k information symbols and (n−k) parity symbol signals in a first decoder;
  regenerating parity symbol estimates from said received signals in an encoder replica;
  comparing said received and regenerated parity symbols to generate (n−k) parity check syndromes each corresponding to successive comparisons between one of said n−k received parity symbols on a corresponding one of said n−k regenerated parity symbols;
  passing or correcting each of said k information symbols in accordance with a majority polling of said n−k parity check syndromes in order to provide k decoded information bits;
  passing or correcting each of said (n−k) received parity symbol signals in accordance with a majority polling of said parity check syndromes;
  correcting selected bits of said parity check syndromes in accordance with said majority pollings in order to obtain (n−k) updated syndromes;
  receiving said k decoded information symbols at a second decoder;
  obtaining said n−k updated syndromes at said second decoder;
  logically combining said k decoded information symbols with selected stages of said (n−k) updated parity syndromes to produce estimates of said information symbols; and
  producing k double decoded information symbols in accordance with weighted majority decisions on said detected information symbols and said plurality of estimates of each of said k information symbols.

16. A method as defined in claim 15, wherein said detected information symbol is assigned a weight in accordance with its soft-detected voltage level.

17. A method as defined in claim 15, wherein said reliability weight assigned to said detected information symbol is forwarded to said second decoder from said first decoder.

18. A method as defined in claim 15, wherein said plurality of estimates of said information symbol are assigned a fixed weight which is less than the maximum weight which may be assigned to said detected information symbol.

19. A method according to either one of claims 14 or 15, wherein k=1 and n=2.

20. In a method of decoding a majority logic decodable code, said method being of the type including receiving at a first decoder information and parity symbol signals representing information and parity symbols in said code, regenerating parity symbol estimates from said received information symbol signals, comparing said received parity symbols and regenerated parity symbol estimates to generate a parity check syndrome, and passing or correcting said received information symbol in accordance with a majority logic decision on said parity check syndrome, the improvement comprising:
  receiving said detected information symbols at a second decoder;
  generating a second set of parity symbol estimates from said decoded information symbols in a second encoder replica;
  comparing said second set of parity symbol estimates to said received parity symbols in order to generate a second parity check syndrome;
  combining said decoded information symbols with selected stages of said second parity check syndrome in order to generate a plurality of estimates of each said information symbol; and
  passing or correcting said detected information symbol in accordance with a majority logic decision on said plurality of estimates and on said detected information symbol.

21. A method as defined in claim 20, wherein said detected information symbol is soft detected and is weighted in said majority logic decision in accordance with its soft-detected voltage level.

22. A method as defined in claim 20, wherein said received parity symbols are soft detected and said plurality of estimates of each said information symbol are weighted in accordance with the soft-detected voltage levels of said received parity symbols.

23. In a method of decoding majority logic decodable codes, said method being of the type including the steps of receiving and detecting at a first decoder information and parity symbol signals, regenerating parity symbol estimates from said received information symbol signals in an encoder replica, comparing said received parity symbol signals and regenerated parity symbol estimates to generate a parity check syndrome, correcting or passing said detected information symbol as a decoded value output in accordance with a majority polling of said parity check syndrome, and updating the contents of said parity check syndrome in accordance with said majority decision, the improvement comprising:
  receiving said detected information symbols at a second decoder;
  receiving said decoded information symbols at said second decoder;
  receiving said updated parity check syndrome at said second decoder;
  combining said decoded information symbols and said updated parity check syndrome in order to obtain a plurality of estimates of said information symbol; and
  passing or correcting said detected information symbol in accordance with a majority logic decision on said information symbol and said plurality of estimates.

24. A method as defined in claim 23, wherein said information symbol is soft detected and is assigned a reliability weight in accordance with its soft detected voltage level.

25. A method as defined in claim 24, wherein said information symbol signal is soft detected at said first decoder and the reliability weight assigned to said detected information symbol is forwarded to said second decoder from said first decoder.

26. A method as defined in claim 24, wherein each of said plurality of estimates is assigned a fixed reliability weight which is less than the maximum permissible reliability weight for said soft-detected information symbol.

* * * * *